United States Patent [19]

Anayama et al.

[11] Patent Number: 5,799,027

[45] Date of Patent: Aug. 25, 1998

[54] STEPPED SUBSTRATE SEMICONDUCTOR LASER FOR EMITTING LIGHT AT SLANT PORTION

[75] Inventors: Chikashi Anayama; Takehiro Fukushima, both of Kawasaki; Akira Furuya, Soja, all of Japan

[73] Assignee: Fujitsu Limited, Kawasaki, Japan

[21] Appl. No.: 821,567

[22] Filed: Mar. 19, 1997

Related U.S. Application Data

[62] Division of Ser. No. 339,213, Nov. 10, 1994, Pat. No. 5,684,818.

[30] Foreign Application Priority Data

Dec. 28, 1993 [JP] Japan ..................... 5-337541
Dec. 28, 1993 [JP] Japan ..................... 5-337542
Mar. 18, 1994 [JP] Japan ..................... 6-048871

[51] Int. Cl.⁶ ............................................. H01S 3/19
[52] U.S. Cl. ........................................ 372/46; 372/45
[58] Field of Search ........................... 372/46, 45, 43

[56] References Cited

U.S. PATENT DOCUMENTS

| 5,065,200 | 11/1991 | Bhat et al. ................... 357/46 |
| 5,375,136 | 12/1994 | Anayama et al. ............. 372/46 |
| 5,621,748 | 4/1997 | Kondo et al. ................. 372/46 |

FOREIGN PATENT DOCUMENTS

| 533197A2 | 3/1993 | European Pat. Off. |
| 0 533 197 A2 | 3/1993 | European Pat. Off. |
| 62-52985 | 3/1987 | Japan. |
| 6-140714 | 5/1994 | Japan. |
| 6-164063 | 6/1994 | Japan. |
| A-9110263 | 7/1991 | WIPO. |

OTHER PUBLICATIONS

Journal of Crystal Growth, vol. 107 (1991) 1 Jan., Nos. 1/4, Amsterdam, NL "Orientation dependence of S, Zn, Si, Te, and Sn doping in OMCVD growth of InP and GaAs: application to DH lasers and lateral p–n junction arrays grown on non–planar substrates", pp. 772–778.

Journal of Quantum Mechanics, vol. QE–17, Jun. 1981, No. 6.; New York USA, pp. 1009–1013, $Ga_xIn_{1-x}As_yP_{1-y}/InP$ Terraced Substrate Single–Mode Laser.

Extended Abstracts of the 1992 International Conference on Solid State Devices and Materials, Tsukuoa, 1992, pp. 619–621, "One–Step–MOVPE–Grown Index–Guide GaInP/AlGaInP Visible Laser Simultaneous Impurity Doping" (no month available).

Bhat et al., "Orientation Dependence of S, Zn, Si, Te, and Sn Doping in OMCVD growth of InP and GaAs", Journal of Crystal Growth pp. 772–778., Jan. 1, 1991.

*Primary Examiner*—Rodney B. Bovernick
*Assistant Examiner*—Yisun Song
*Attorney, Agent, or Firm*—Armstrong, Westerman, Hattori, McLeland & Naughton

[57] ABSTRACT

In a slant plane light emission type semiconductor laser whose laser structure can be formed on a stepped substrate by a series of MOCVD growth processes, the width of the active layer at the slant portion is set to 2.5 µm or less or the angle between the flat portion and slant portion is set to 12 degrees or less. The semiconductor laser having such a structure can emit light having a single peak at the near field.

13 Claims, 18 Drawing Sheets

FIG.9A
$(Al_{0.4}Ga_{0.6})_{0.5}In_{0.5}P$ —5a
$Ga_{0.44}In_{0.56}As_{0.08}P_{0.92}$ —5b
$(Al_{0.4}Ga_{0.6})_{0.5}In_{0.5}P$ —5a
FIG.9B
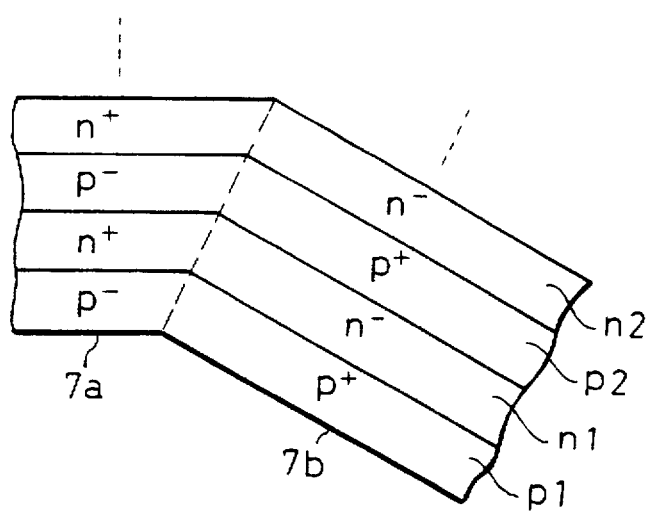
FIG.9C
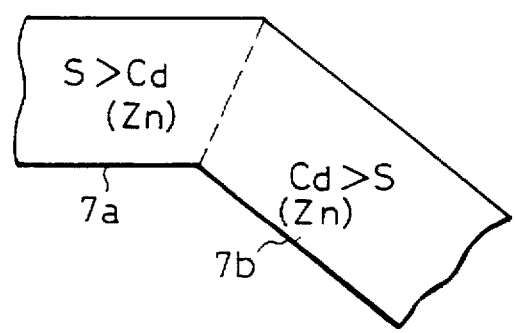

STEPPED SUBSTRATE SEMICONDUCTOR LASER FOR EMITTING LIGHT AT SLANT PORTION

This is a division of application Ser. No. 08/339,213 filed Nov. 10, 1994, now U.S. Pat. No. 5,684,818.

BACKGROUND OF THE INVENTION a) Field of the Invention

The present invention relates to a semiconductor laser, and more particularly to a semiconductor laser without an embedded mesa structure.

b) Description of the Related Art

A semiconductor laser is used as a light source, for example, for reading a bar code used by a point of sales (POS) system, for reading and writing data from and to an optical disc, and for forming a latent image in a laser printer. A semiconductor laser emitting a visible light in a 0.6 μm band is expected to be a light source capable of realizing a high performance of optical information processing apparatuses.

Visible light semiconductor lasers in such application fields have been desired to have performances such as a low cost, a low oscillation threshold current, and a high light output. Other performances are also desired, including a high light output kink level, a high efficiency, a low consumption current, a single peak in a far field pattern, and a small astigmatism.

A visible light semiconductor laser of a 0.6 μm band made of AlGaInP material is known.

In embedding an active layer such as AlInP for emitting light in the 0.6 μm band in a laser using AlGaInP material with a wide band gap, the active layer is sandwiched between cladding layers containing Al, the device is mesa-etched, and the mesa-etched sides are embedded with material containing Al.

AlGaInP based material is grown by metal organic vapor phase epitaxy (MOVPE) or molecular beam epitaxy (MBE) from the viewpoint of controllability of Al. Material containing Al is most likely to be oxidized, and if it is once exposed in the air, the surface of a layer containing Al is oxidized. It is very difficult to grow crystals containing Al on the oxidated Al-containing material. It is therefore impractical to embed Al-containing material with another Al-containing material.

It has been therefore desired to manufacture a semiconductor laser of AlGaInP based material by a series of crystal growth processes without exposing the substrate in the air. However, the semiconductor laser is required to confine light in the active layer.

If a low refraction index layer, a high refraction index layer, and a low refraction index layer are epitaxially formed in this order on an underlie layer, light can be confined in the direction perpendicular to the underlie layer. However, if such a laminated layer is grown on a flat underlie layer, light cannot be confined in the lateral direction.

If an underlie crystal layer has bends or flexions on the surface thereof, a layer epitaxially grown thereon also has corresponding bends. If an active layer is bent, a cladding layer appears at the linear extension of the active layer, so that light propagating in the active layer feels a lowered effective refractive index. It is therefore possible to confine light in the lateral direction by bending the active layer at two expected side end positions of an active layer.

For example, if a substrate surface is worked to have a mesa shape and an active layer is epitaxially grown over the substrate surface, the active layer has a flat plane at the mesa top and a slant plane at the bent mesa sides. This method can realize a laser structure capable of confining light both in the perpendicular and lateral directions.

However, similar to light confinement, current of a semiconductor laser is also required to be confined in lateral directions so as to pass the current through the effective active region. The above-described structure cannot confine current in lateral directions.

Some impurities in a group III-V compound semiconductor change their incorporation or capture probabilities depending upon a crystal plane. For example, a p-type impurity Zn has a higher incorporation probability at the plane (111)A than at the plane (100).

Contrary to the above, an n-type impurity Se has a low incorporation probability at the plane (111)A than at the plane (100). Use of these impurities having different incorporation probabilities allows crystal growth to selectively form p- and n-type regions in the same layer depending on the crystal planes.

FIG. 17 shows the structure of a V-groove laser proposed in Japanese Patent Laid-open Publication 62-52985. On the surface of a p-type GaAs substrate 11 having the plane (100), a V-shaped groove with slant planes of the plane orientation (111)A is formed by chemical etching.

On this substrate 11, p-type GaAs layers 12A and n-type GaAs layers 12B are alternately laminated to form a four-layered lamination. A p-type $Ga_{0.55}Al_{0.45}As$ cladding layer 13, an undoped $Ga_{0.9}Al_{0.1}As$ active layer 14, an n-type $Ga_{0.55}Al_{0.45}As$ cladding layer 15, and an n-type GaAs cap layer 16 are sequentially grown over the substrate 11.

Metal organic vapor phase epitaxy (MOVPE) is used for crystal growth, by using diethylzinc (DEZn) as p-type dopant and hydrogen selenide ($H_2Se$) as n-type dopant.

In the GaAs laminated layer with alternative p- and n-types grown on the groove with the plane (111)A, the n-type GaAs layer is inverted into a p-type by diffusion of p-type dopant Zn.

At the flat plane of the plane orientation (100), the n-type GaAs layer is not inverted into a p-type so that a plurality of pn junctions are formed over the flat plane. In this manner, a pn multi-layer film as a current blocking region can be formed over the flat plane in a self-aligned manner. This manufacturing method would be applicable to AlGaInP based semiconductor lasers.

As described above, in order to make a semiconductor laser of AlGaInP based material forming a waveguide of a real refractive index, it is desired to form a laser structure by a series of crystal growth processes. It is therefore difficult to use a general mesa type embedded laser structure.

Although a technology of automatically forming a current blocking region by a series of crystal growth processes by using a substrate with a V-shape groove or other grooves have been proposed, this technology is difficult to manufacture a high performance semiconductor laser.

SUMMARY OF THE INVENTION

It is an object of the present invention to provide a semiconductor laser and a method of manufacturing the same, capable of forming a principal laser structure by a series of crystal growth processes and realizing a high performance semiconductor laser.

According to one aspect of the present invention there is provided a semiconductor laser comprising: a stepped substrate of group III-V compound semiconductor having two flat surfaces exposing a plane (100) or a plane (n11)A (n being a real number, 7<n) and a slant surface exposing a plane (m11)A (m being a real number, 2≦m≦7) and interconnecting the two flat surfaces; an active layer having two flat surfaces exposing a plane (100) or a plane (n11)A and a slant surface having a width of 2.5 μm or less and exposing a plane (k11)A (k being a real number, 3≦k≦7), the slant surface of the active layer interconnecting the two flat surfaces of the active layer; a first p-type cladding layer laminated on said active layer and having a first p-type impurity concentration at a region along the slant surface and a second p-type impurity concentration, which is lower than said first p-type carrier concentration at said slant region, at a region along the flat surfaces; and a single cladding and blocking layer laminated on said first p-type cladding layer and forming a second p-type cladding layer at a region along the slant surface and an n-type current blocking layer at a region along the flat surfaces.

According to another aspect of the present invention, there is provided a semiconductor laser having: a stepped substrate of group III-V compound semiconductor having two flat surfaces exposing a plane (100) or a plane (n11)A (n being a real number, 7<n) and a slant surface exposing a plane (m11)A (m being a real number, 2≦m≦7) and interconnecting the two flat surfaces; an active layer having two flat surfaces exposing the plane (100) or the plane (n11)A and a slant surface having a width of 2.5 μm or less and exposing a plane (k11)A (k being a real number, 3≦k≦7), the slant surface of the active layer interconnecting the two flat surfaces of the active layer; a first p-type cladding layer laminated on the active layer and having a high p-type impurity concentration at a region along the slant surface and a low p-type impurity concentration at a region along the flat surfaces; and a single cladding and blocking layer laminated on the first p-type cladding layer and forming a second p-type cladding layer at a region along the slant surface and an n-type current blocking layer at a region along the flat surfaces.

In a slant plane light emission type semiconductor laser formed on a stepped substrate, a single peak beam characteristic even in the near field pattern can be obtained by setting the width of the slant portion of the active layer to 2.5 μm or less.

According to another aspect of the present invention, there is provided a semiconductor laser having: a stepped substrate of group III-V compound semiconductor having two flat surfaces exposing a plane (100) or ae plane (n11)A (n being a real number, 7<n) and a slant surface exposing a plane (m11)A (m being a real number, 2≦m≦7) and interconnecting the two flat surfaces; an active layer having two flat surfaces exposing a plane (100) or a plane (n11)A and a slant surface having an angle of 12 degrees or less relative to the flat surfaces and exposing a plane (k11)A (k being a real number, 3≦k≦7), the slant surface of the active layer interconnecting the two flat surfaces of the active layer; a first p-type cladding layer laminated on the active layer and having a high p-type impurity concentration at a region along the slant surface and a low p-type impurity concentration at a region along the flat surfaces; and a single cladding and blocking layer laminated on the first p-type cladding layer and forming a second p-type cladding layer at a region along the slant surface and an n-type current blocking layer at a region along the flat surfaces.

In a slant plane light emission type semiconductor laser formed on a stepped substrate having flat surfaces and a slant surface, a single peak beam characteristic even in the near field pattern can be obtained by setting the angle between the slant surface and flat surfaces of the active layer to 12 degrees or smaller.

According to another aspect of the present invention, there is provided a method of manufacturing a semiconductor laser including the steps of: preparing a stepped substrate of group III-V compound semiconductor having two flat surfaces exposing a plane (100) or a plane (n11)A (n being a real number, 7<n) and a slant surface exposing a plane (m11)A (m being a real number, 2≦m≦7) and interconnecting the two flat surfaces; epitaxially growing on the stepped substrate an active layer having two flat surfaces exposing a plane (100) or a plane (n11)A and a slant surface exposing a plane (k11)A (k being a real number, 3≦k≦7), the slant surface of the active layer interconnecting the two flat surfaces of the active layer; epitaxially growing on the active layer a first p-type cladding layer having a high p-type impurity concentration at a region along the slant surface and a low p-type impurity concentration at a region along the flat surfaces; and epitaxially growing on the first p-type cladding layer a p-type thin layer and an n-type thin layer alternately two periods or more, the p-type thin layer having a high p-type impurity concentration at a region along the slant surface and a low p-type impurity concentration at a region along the flat surfaces, and the n-type thin layer having a low n-type impurity concentration at a region along the slant surface and a high n-type impurity concentration at a region along the flat surfaces.

A stepped substrate having the flat surfaces exposing the plane (n11)A and the slant surface exposing the plane (m11)A is prepared, and p- and n-type impurities having different incorporation probabilities into crystals depending upon a crystal plane are doped alternately two periods or more to grow p- and n-type thin films and form the cladding and blocking layer. It is therefore possible to realize a semiconductor laser of high performance.

An effective active layer is formed by a slant region having no bent portion except the two side ends. If a cladding layer on an active layer having the plane (k11)A is formed, uniform doping is possible. It is also possible to provide a high performance of a semiconductor laser by preventing impurity pairing.

According to another aspect of the present invention, there is provided a semiconductor laser having: a stepped substrate of group III-V compound semiconductor having two flat surfaces exposing a plane (100) or a plane (n11)A (n being a real number, 7<n) and a slant surface exposing a plane (m11)A (m being a real number, 2≦m≦7) and interconnecting the two flat surfaces; an active layer formed on the stepped substrate and having two flat surfaces exposing a plane (100) or aplane (n11)A and a slant surface having a width of 2.5 μm or less and exposing a plane (k11)A (k being a real number, 3≦k≦7), the slant surface of the active layer interconnecting the two flat surfaces of the active layer; a first p-type cladding layer formed on the active layer and having a high p-type impurity concentration at a region along the slant surface and a low p-type impurity concentration at a region along the flat surfaces; and a single cladding and blocking layer formed on the first p-type cladding layer, having a high p-type impurity concentration and a low S concentration at a region along the slant surface and a low p-type impurity concentration and a high S concentration at a region along the flat surfaces, the p-type impurity being Zn or Cd, S and Zn or Cd being doped at the same time, and forming a second p-type cladding layer at a region along the slant surface and a n-type current blocking layer at a region along the flat surfaces.

If the current blocking region is too thick, the resistance of the second p-type cladding layer increases and the semiconductor laser performance is degraded. If the current blocking region is too thin, the current blocking function is lost. By setting the thickness of the current blocking region in the range from 0.15 to 0.35 µm, it becomes possible to reduce the resistance of the second p-type cladding layer while retaining the current blocking effect.

According to another aspect of the present invention, there is provided a semiconductor laser having: a stepped substrate of group III-V compound semiconductor having two flat surfaces exposing a plane (100) or the plane (n11)A (n being a real number, 7<n) and a slant surface exposing a plane (m11)A (m being a real number, 2≦m≦7) and interconnecting the two flat surfaces; an active layer having two flat surfaces exposing a plane (100) or a plane (n11)A and a slant surface having a width of 2.5 µm or less and exposing a plane (k11)A (k being a real number, 3≦k≦7), the slant surface of the active layer interconnecting the two flat surfaces of the active layer; a first p-type cladding layer laminated on the active layer and having a high p-type impurity concentration at a region along the slant surface and a thickness in the range from about 0.15 to 0.35 µm and a low p-type impurity concentration at a region along the flat surfaces; and a single cladding and blocking layer laminated on the first p-type cladding layer and forming a second p-type cladding layer at a region along the slant surface and an n-type current blocking layer at a region along the flat surfaces.

If the first p-type cladding layer is too thick, current once confined by the current blocking layer again expands. If the first p-type cladding layer is too thin, the function of the first p-type cladding layer sandwiched between the current blocking region and the active layer is lost. By setting the thickness of the first p-type cladding layer in the range from 0.15 to 0.35 µm, it becomes possible to prevent excessive expansion of current while retaining the function of the first p-type cladding layer.

According to another aspect of the present invention, there is provided a semiconductor laser having: a stepped substrate of group III-V compound semiconductor having two flat surfaces exposing a plane (100) or a plane (n11)A (n being a real number, 7<n) and a slant surface exposing a plane (m11)A (m being a real number, 2≦m≦7) and interconnecting the two flat surfaces; a buffer layer formed on the stepped substrate having two flat surfaces exposing a plane (100) or a plane (n11)A and a slant surface exposing a plane near a plane (411)A; an n-type cladding layer formed on the buffer layer and having two flat surfaces exposing a plane (100) or a plane (n11)A and a slant surface having a crystal plane different from that of the slant surface of the buffer layer; an active layer having two flat surfaces exposing a plane (100) or a plane (n11)A and a slant surface exposing a plane (k11)A (k being a real number, 3≦k≦7), the slant surface of the active layer interconnecting the two flat surfaces of the active layer; a first p-type cladding layer laminated on the active layer and having a high p-type impurity concentration at a region along the slant surface and a low p-type impurity concentration at a region along the flat surfaces; a single cladding and blocking layer laminated on the first p-type cladding layer and forming a second p-type cladding layer at a region along the slant surface and an n-type current blocking layer at a region along the flat surfaces; and a third p-type cladding layer formed on the cladding and blocking layer, wherein the thickness of the n-type cladding layer at the slant surface is thicker than the total thickness of the first, second, and third p-type cladding layers.

The n-type cladding layer has slant surfaces with different crystal planes at the top and bottom thereof. Unevenness of the thickness of the n-type cladding layer means an uneven distribution of light absorption at the slant portion. If the n-type cladding layer is made thicker than the p-type cladding layer, the positional distribution of light absorption mainly depends upon the p-type cladding layer. Accordingly, it is possible to suppress uneven positional distribution of light absorption.

BRIEF DESCRIPTION OF THE DRAWINGS

FIGS. 9A to 9C are partially enlarged cross sectional views of the semiconductor laser shown in FIG. 7.

DETAILED DESCRIPTION OF THE PREFERRED EMBODIMENTS

In order to facilitate the understanding of this invention, a previous proposal made by the inventors will be first explained.

Figure 1:
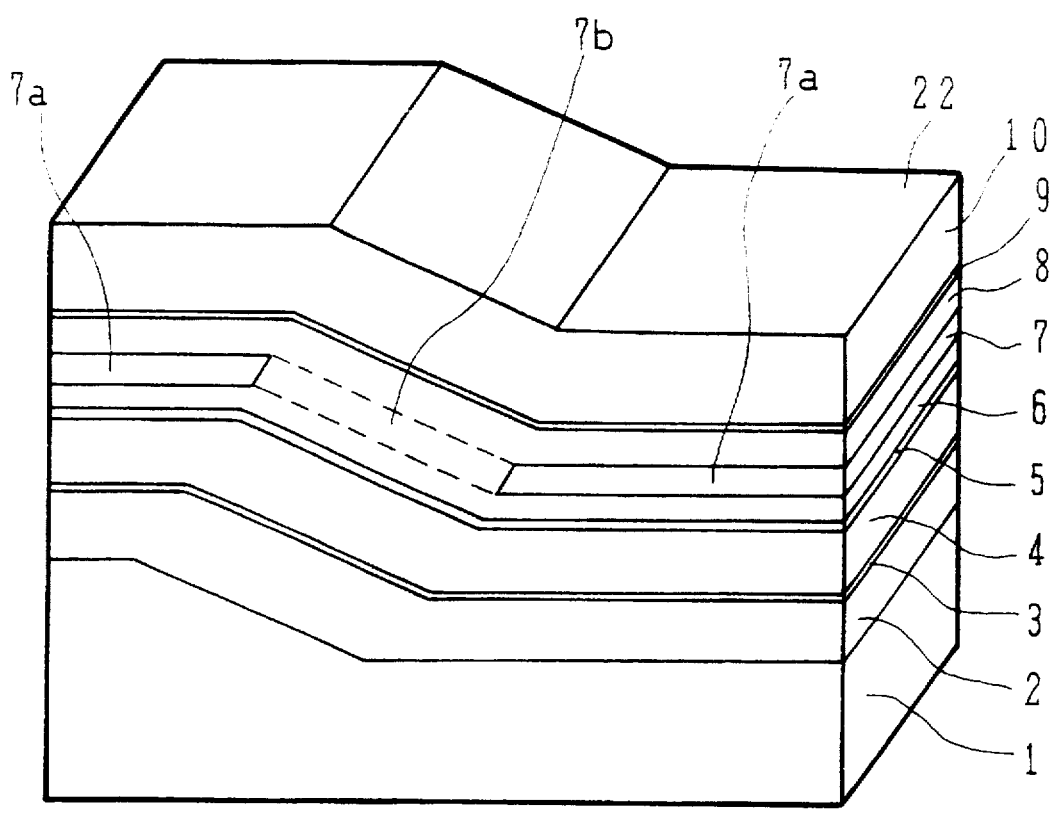
FIG. 1 is a perspective view of a semiconductor laser previously proposed by the present inventors.

FIG. 1 shows a slant plane light emission type semiconductor laser according to a previous proposal made by the inventors (described, for example, in U.S. Ser. No. 228,453 filed on Apr. 15, 1994 which is a continuation application of U.S. Ser. No. 947,171 filed on Sep. 18, 1992, which is incorporated herein by reference). An n-type GaAs substrate 1 has stepped surfaces of the plane (100), and the slant plane thereof at a step portion has the plane (311)A. On the GaAs substrate 1, an n-type GaAs buffer layer 2 is formed over which an n-type GaInP intermediate layer 3 and an n-type AlGaInP cladding layer 4 are formed. The GaInP intermediate layer 3 has a band gap which is an intermediate level between the band gaps of the GaAs buffer layer and the AlGaInP cladding layer 4, thereby the GaInP intermediate layer 3 relaxing a potential barrier at a heterojunction.

A multi quantum well (MQW) active layer 5 is formed on the n-type AlGaInP cladding layer 4. The active layer is not intentionally doped with impurities and has flat planes and a slant plane similar to the surface of the underlie layer structure. The active layer 5 is covered with AlGaInP cladding layers 6, 7, and 8. As current flows in the slant portion of the active layer, recombination of carriers occurs and light is emitted. This light is confined by the cladding layers over and under the active layer 5 in the perpendicular direction and propagates in the active layer slant stripe portion in the longitudinal direction of the stripe. The light propagating in lateral directions enters the upper and lower cladding layers. However, since the cladding layers have a lower refractive index than the active layer, the distribution of laser beams is confined in the slant portion in lateral directions. In this manner, light confinement is achieved also in the lateral direction.

An AlGaInP layer 7 having a p-type region and n-type regions is being formed on the p-type first cladding layer 6. This AlGaInP layer 7 is doped with both types of impurities Se and Zn as seen from FIG. 2. An n-type impurity Se indicated by solid circles has a high incorporation probability or factor at the plane (100), and lowers the incorporation probability toward the plane (311)A. A p-type impurity Zn indicated by hollow circles has a high incorporation factor at the plane (311)A, and lowers the incorporation factor toward the plane (100). Both doped impurities Se and Zn in the AlGaInP layer 7 have different incorporation factors depending upon the crystal plane so that they show the impurity concentrations indicated by solid triangles and hollow triangles. Namely, the n-type regions are formed on the flat planes of the plane (100), and the p-type region is formed on the plane near the plane (311)A.

Therefore, the AlGaInP layer 7 of the structure shown in FIG. 1 forms a second p-type cladding layer 7b on the slant plane and n-type current blocking layers 7a on the flat planes.

On the AlGaInP layer 7, a third p-type AlGaInP cladding layer 8, a p-type GaInP intermediate layer 9, and a p-type GaAs contact layer 10 are laminated in this order.

A lamination of layers from the buffer layer 2 to the contact layer 10 is grown by a series of MOVPE processes.

In the above manner, a semiconductor laser structure of a 0.6 μm band can be grown by a series of MOVPE processes.

This slant plane light emission type semiconductor laser has the characteristics that a far field pattern has a single peak and a near field pattern has double peaks.

Figure 3A:
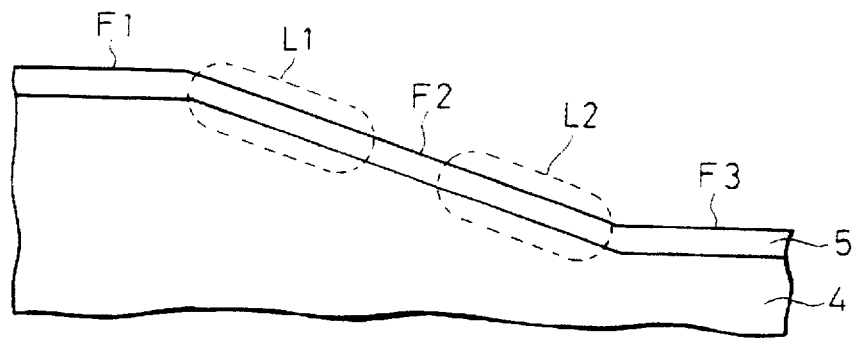
FIGS. 3A to 3C are schematic cross sectional views for analyzing double peaks in a near field pattern of a slant plane light emission type semiconductor laser.

FIG. 3A is an enlarged partial view of only the active layer portion of the semiconductor laser shown in FIG. 1. As shown, two separate regions L1 and L2 having a high light emission intensity exist at the slant portion of the active layer 5, and the positions of these regions change with time. The two light emission regions form double peaks in a near field pattern and a single peak in a far field pattern. It can be therefore supposed that two light emission regions establish one light emission mode. A single peak in the far field pattern poses no practical problem for applications to, for example, optical communications.

However, in application fields such as magneto optical disc drives which apply a laser beam of a small diameter to an object at a near distance, a single peak is desirable at the near field.

The inventors have analyzed why a slant plane light emission type semiconductor laser has double peaks in the near field pattern. The active layer 5 has different crystal planes between the flat planes F1 and F3 and the slant plane F2. It is conceivable that while growing material such as AlGaInP whose composition may change, the incorporation factor of each composition becomes slightly different depending upon a difference between crystal planes.

Figure 3B:
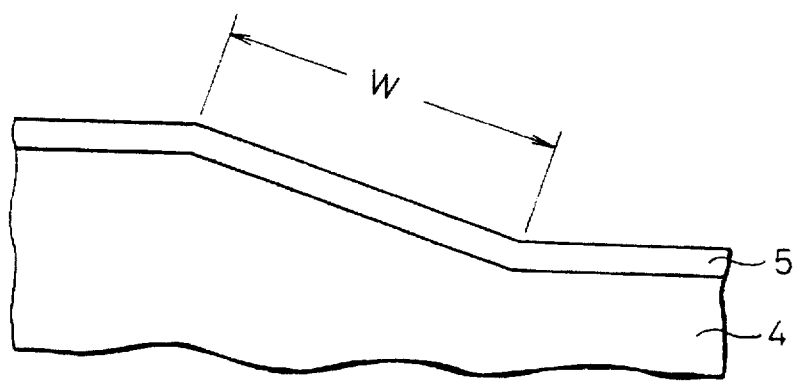
Figure 3C:
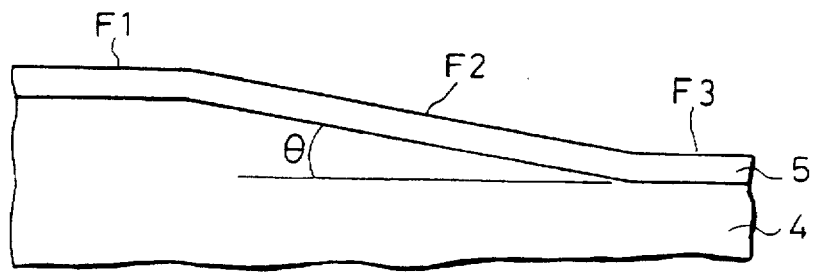

The slant plane F2 has a narrow width of several μm at most, and the flat planes F1 and F2 having a different crystal plane from the crystal plane of the slant portion F2 extend broadly on both the sides of the slant plane F2. From this reason, the composition in the slant plane F2 is supposed to change minutely. As a means for preventing such a composition change in the slant portion F2, two methods have been used, one method limiting the width W of the slant plane as shown in FIG. 3B and the other method reducing the angle θ between the flat plane and the slant plane as shown in FIG. 3C. According to a conventional method, the width of a slant plane is about 3.5 μm, and the angle θ between the slant plane and the flat plane is about 15 degrees even if the substrate main plain is offset in the direction from the plane (100) to the plane (111)A.

Figure 4A:
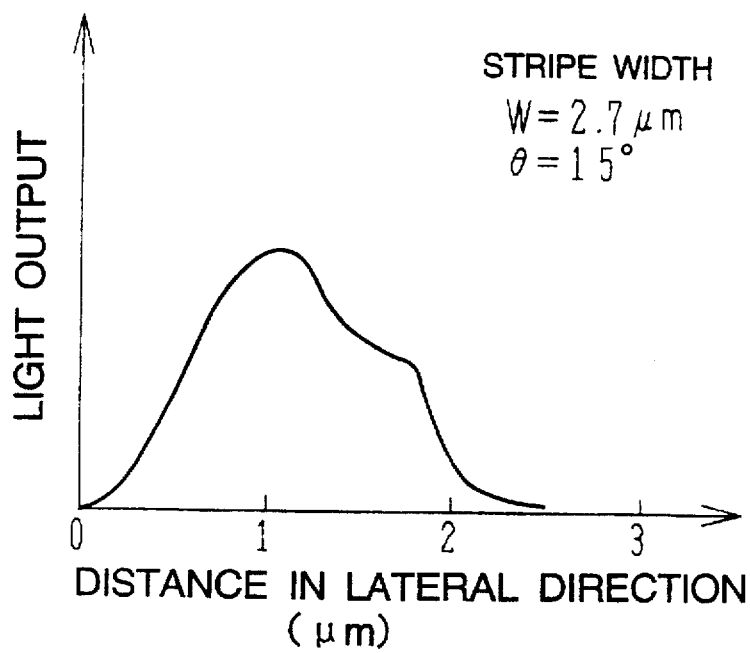
FIGS. 4A and 4B are graphs showing examples of light output distributions when the width of the slant plane of an active layer is narrowed.
Figure 4B:
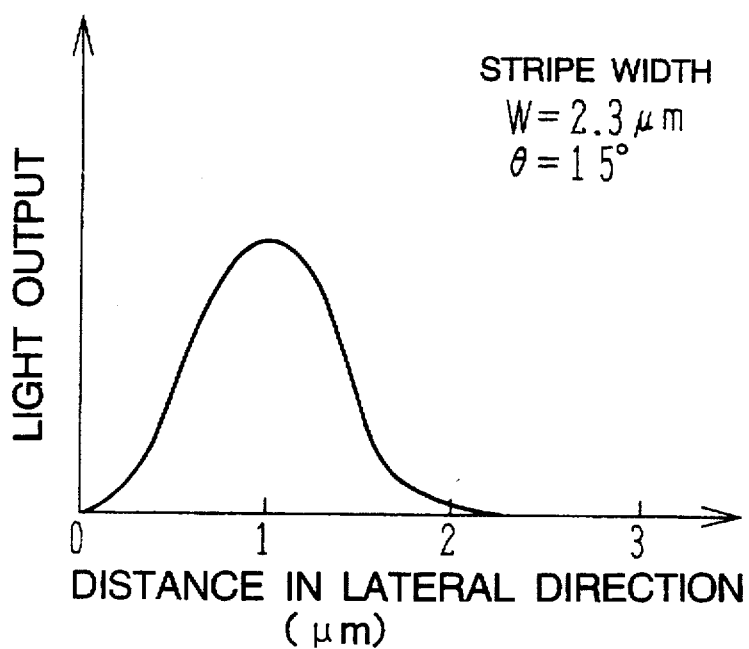

FIGS. 4A and 4B are graphs showing the experiment results of reducing the stripe width of the active layer slant portion. FIG. 4A shows a distribution of light output as a function of a distance in the traverse direction of the stripe when the stripe width of the slant portion was set to 2.7 μm and the angle of the slant plane relative to the flat plane was set to 15 degrees. As shown in FIG. 4A, although the light output is continuous, it shows clear double peaks.

FIG. 4B shows a distribution of light output when the stripe width W was reduced to 2.3 μm. The angle θ of the slant plane relative to the flat plane was set to 15 degrees same as FIG. 4A As seen from the graph, the light output at the near field shows a clear single peak.

As seen from the above experiment results, if the stripe width W of the active layer slant portion is set to about 2.5 μm or narrower, a single peak can be obtained even at the near field.

This is supposed that uneven distribution of compositions in the slant portion becomes difficult to be formed, by narrowing the slant portion width W.

Although a single peak can be obtained by narrowing the width of the active layer slant portion, a narrow slant portion means a low level of catastrophic optical damages (COD) at the end surfaces of the semiconductor laser. For example, a light source for a magneto optical storage device requires a light output of 35 mW at 50° C. This light output requires to set the width of an active layer slant portion to at least 2.5 μm. However, if the slant portion width is increased more than 2.5 μm, double peaks appear in the near field pattern.

The inventors have discovered that double peaks at the near field change also with an angle between the active layer slant portion and the flat portion. The width of an active layer slant portion and the angle of the slant portion relative to the flat portion play an important role for obtaining a single peak at the near field. Various crystal planes may appear at the slanted portion on a substrate surface when the substrate is etched to form a step portion for the subsequent epitaxial growth of layers thereon. What slant portions are formed on crystal layers formed on the substrate surface were measured using an off-angle of the substrate as a parameter.

Figure 5:
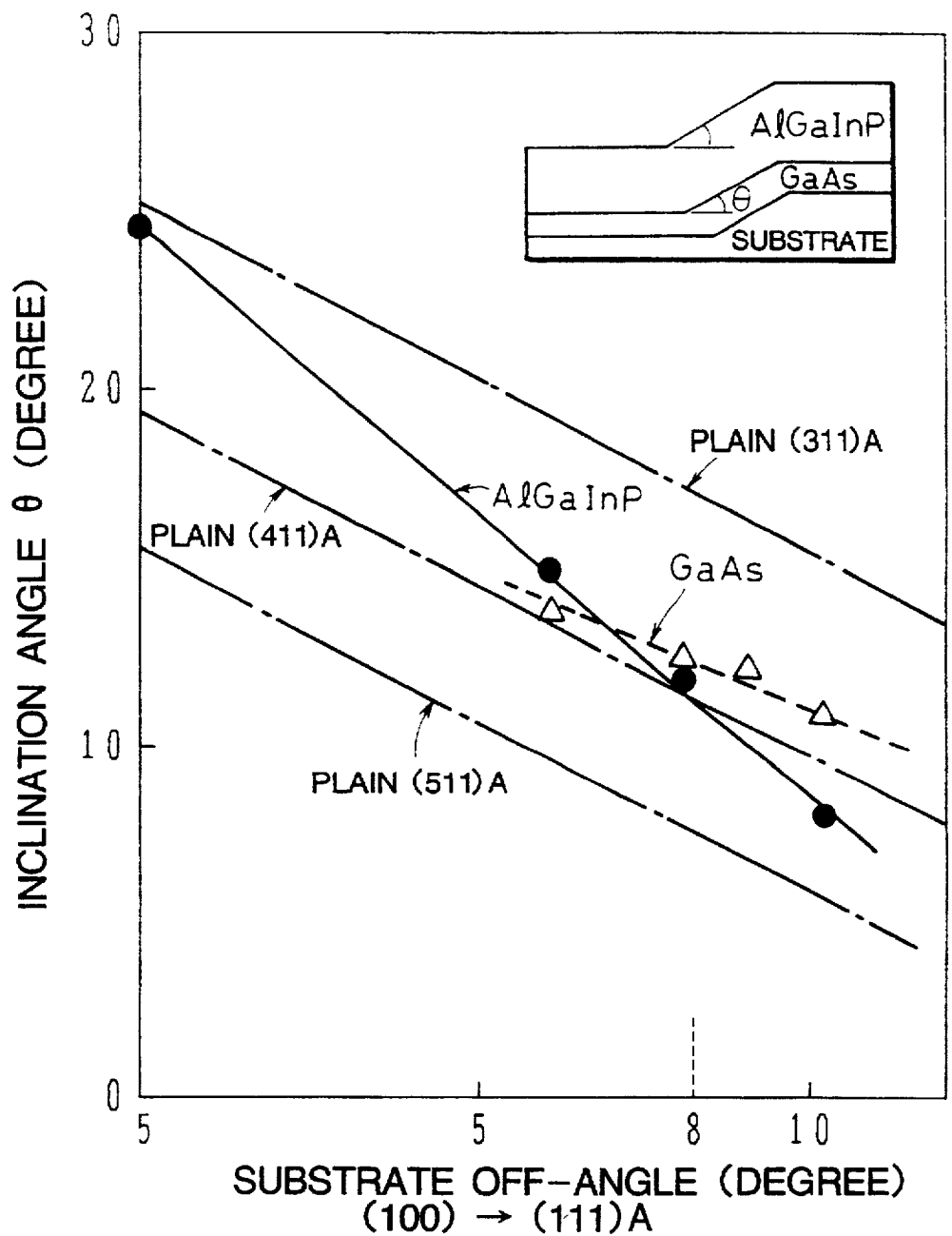
FIG. 5 is a graph showing inclination angles of growth of a GaAs buffer layer and an AlGaInP cladding layer on a stepped substrate.

FIG. 5 shows the measurement results of an angle of a slant portion relative to a flat portion of a GaAs buffer layer having a thickness of 1 µm grown on a substrate and of a AlGaInP layer having a thickness of 2 µm formed on the GaAs layer, by changing the off-angle of the substrate in the direction from the plane (100) to the plane (111)A. The abscissa represents an off-angle of the substrate, and the ordinate represents an angle of the slant portion relative to the flat portion.

The GaAs buffer layer grown on a GaAs substrate to a thickness of 1 µm had generally a stable plane near the plane (411)A on the slant portion surface over the whole off-angle range of the substrate, as indicated by hollow triangles. It is desirable, however, to set the thickness of the buffer layer to about 1 µm or more in order to form a reliable plane on the slant portion of the buffer layer surface. If a buffer layer is grown on a substrate to a thickness of about 1 µm or more, generally the plane (411)A can be obtained with good reproducibility on the slant portion irrespective of the substrate off-angle.

The angle changes at the slant portion of an AlGaInP cladding layer grown on the GaAs buffer layer having a thickness of 1 µm and formed on a substrate. The angle at the slant portion of an AlGaInP cladding layer grown to 1 to 1.5 µm becomes stable. Therefore, the angle of the slant portion relative to the flat portion was measured for AlGaInP cladding layers grown to 2 µm. The measurement results are indicated by solid circles.

The slant angle θ of the slant portion relative to the flat portion changes generally linearly as the off-angle increases. At an off-angle of 0° a plane near the plane (311)A appears on the slant portion and the slant angle is about 25 degrees. At an off-angle of 8° a plane near the angle (411)A appears on the slant portion. At an off-angle of 10° a plane intermediate between the plane (411)A and the plane (511)A appears. In this manner, a grown AlGaInP layer has a grown surface plane determined by the substrate off-angle.

The shape of the buffer layer surface is also affected by the shape of a slant portion of a stepped substrate.

Figure 6A:
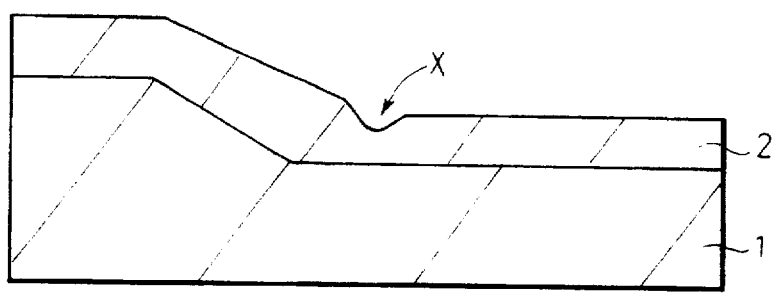
FIGS. 6A to 6C are schematic cross sectional views showing the growth state of a buffer layer on a substrate having different angle slant planes.

FIG. 6A schematically illustrates a phenomenon which occurs if the slant portion of a stepped substrate is slightly steeper than the plane (411)A. If the slant portion of a stepped substrate is steep and a buffer layer is thin, a pit X shown in FIG. 4A is formed. A semiconductor laser with a laser structure having a cladding layer laminated upon a substrate having such a pit had a higher oscillation threshold value. Such a pit disappears if a sufficiently thick buffer layer is grown.

Figure 6B:
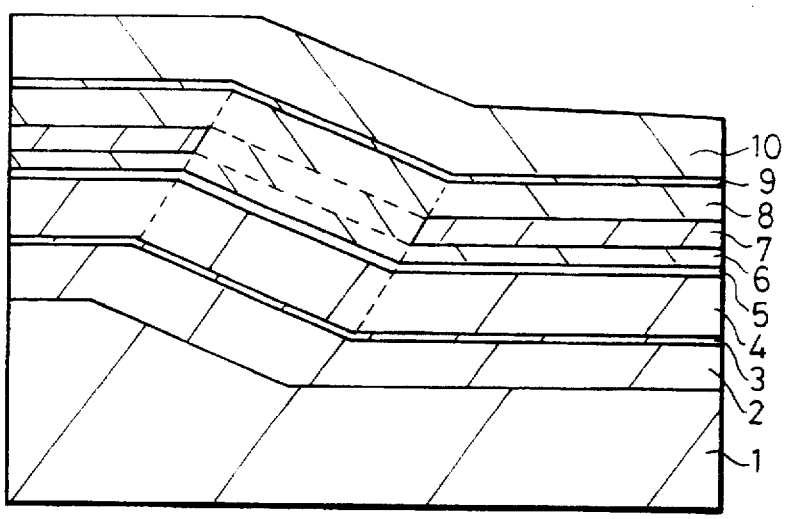

FIG. 6B illustrates a case wherein on a GaAs substrate 1 having generally the plane (411)A at its slant portion, a GaAs buffer layer 2 is grown to stably form the plane (411)A on the slant portion of the buffer layer 2. In this case, it is easy to form a slant portion of an active layer 5 as designed, by growing an intermediate layer 3, a cladding layer 4, and the active layer 5 respectively in this order on the buffer layer 2.

Figure 6C:
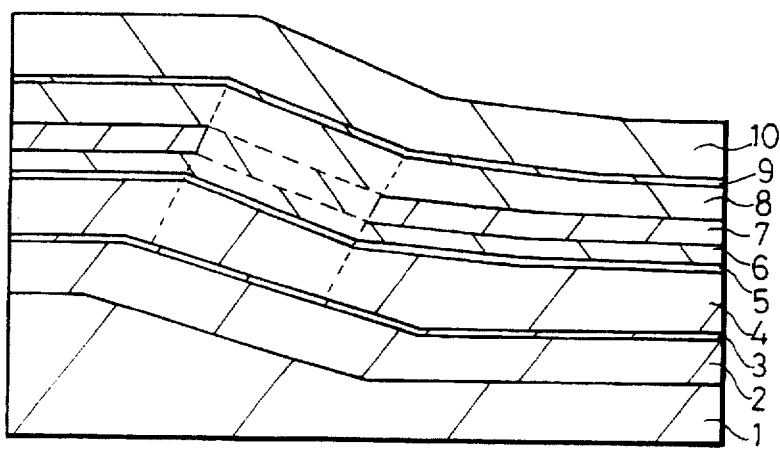

FIG. 6C illustrates a case wherein the slant portion of a GaAs stepped substrate 1 is more gentle than the plane (411)A. If a GaAs buffer layer 2, an intermediate layer 3, a cladding layer 4, and an active layer 5 are formed on the GaAs substrate 1 having a gentle slant portion, the width of the slant portion of the active layer 5 becomes different from a designed width, and it tends to become too narrower.

Since a step of a stepped substrate is formed by wet etching, a finely uneven plane is formed on the slant portion. However, if the plane at the slant portion is steeper than the plane (411)A, for example, near the plane (311)A, the final stripe width can be stabilized.

For example, even if a stepped substrate having a steep slant portion having a plane near the plane (311)A is used, a slant portion of each layer formed over a sufficiently thick buffer layer can have a smooth plane of the plane (411)A. In order to have a smooth plane of the plane (411)A with good reproductivity, it is desirable to grow a buffer layer to a thickness of about 1 µm or more.

If such a stable slant portion is formed, the angle between the active layer flat portion and the slant portion can be controlled by selecting a proper plane of a substrate. By precisely controlling a step of a stepped substrate, the stripe width of an active layer slant portion can be controlled.

Figure 2:
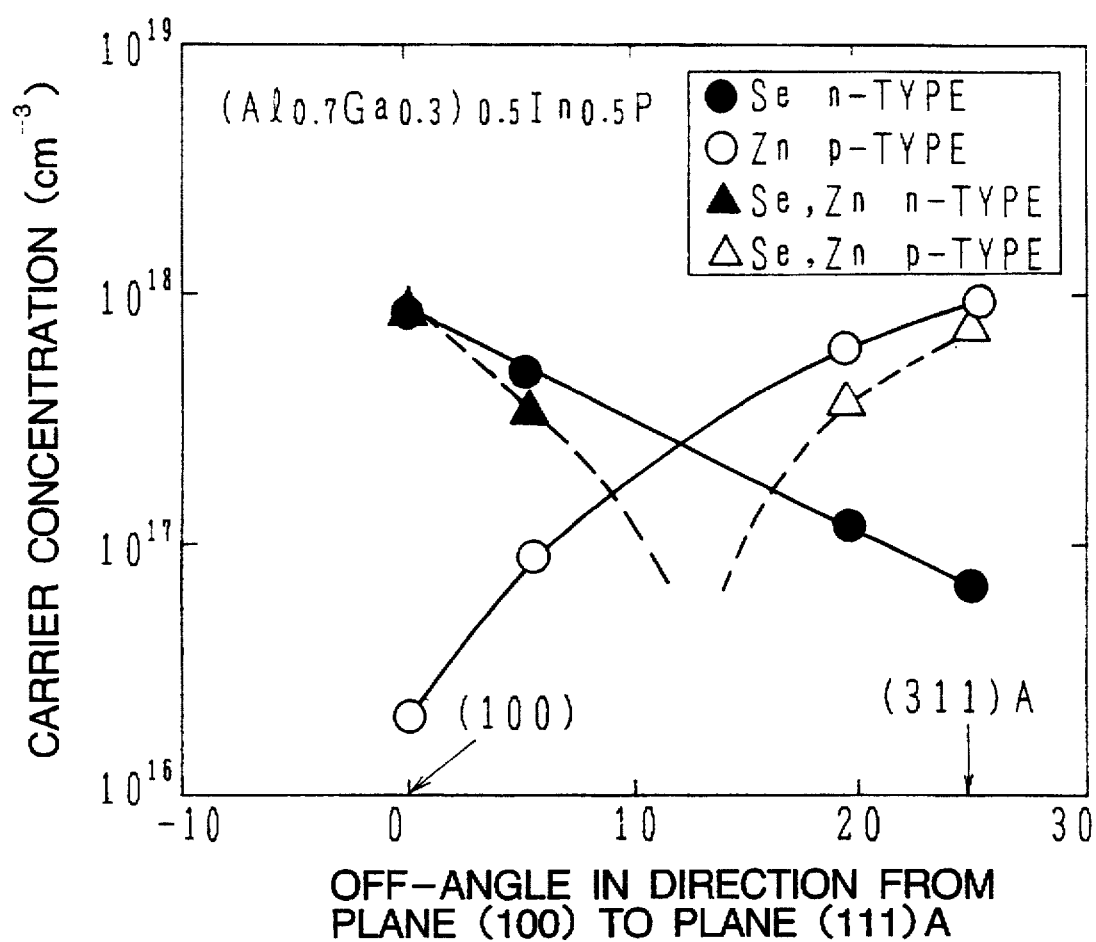
FIG. 2 is a graph showing a crystal plane dependency of doping.

As the angle θ between the active layer slant portion and the flat portion becomes smaller, an angle between the slant portion and the flat portion of a cladding and blocking layer formed on the active layer becomes smaller. The cladding and blocking layer forms a lateral pn junction by positively using a dependency of an impurity incorporation factor upon a crystal plane. With an angle of about 25 degrees between the flat portion and the slant portion, good p-type regions and n-type regions could be formed by using, as impurities, Se and Zn having a dependency of a impurity concentration upon a crystal plane such as shown in FIG. 2. As the angle between the slant portion and the flat portion becomes small, the resistance of a cladding layer becomes high because it becomes difficult for Zn and Se to obtain a sufficient concentration difference. A crystal plane dependency of impurities, particularly n-type impurities is desired to be improved.

A higher crystal plane dependence is obtained by using S as the n-type impurity than Se. Although p-type impurity Zn has a high crystal plane dependency, a higher crystal plane dependency can be obtained by using Cd. It is preferable however to set the angle θ between the slant portion and the flat portion to 3 degrees or more in order to form a potential barrier having a good current blocking function.

Figure 7:
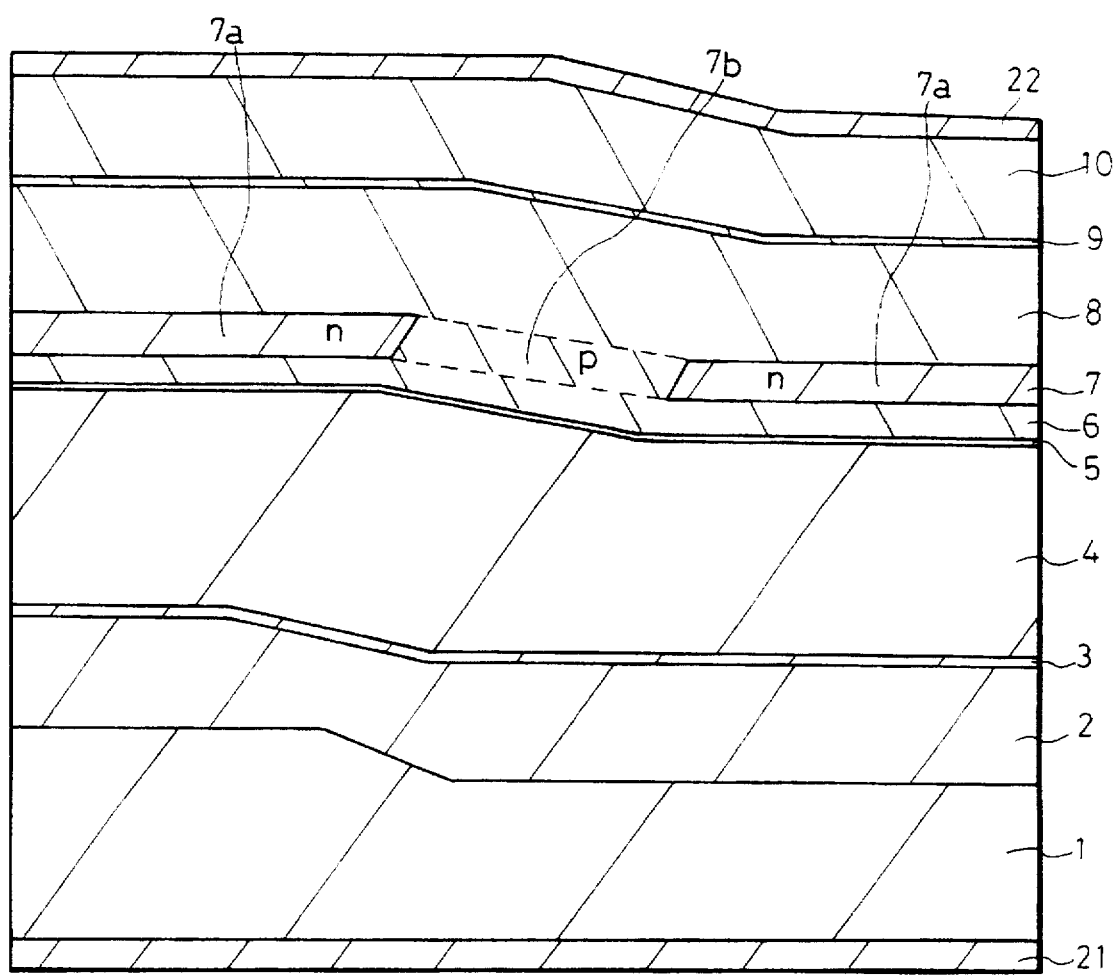
FIG. 7 is a cross sectional view of a semiconductor laser according to an embodiment of the invention.
Figure 8A:
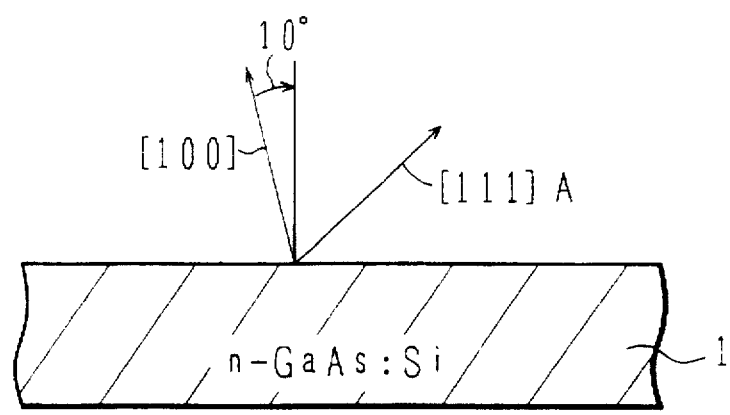
FIGS. 8A to 8D are schematic cross sectional views explaining a method of manufacturing a semiconductor laser according to an embodiment of the invention.

FIG. 7 is a cross sectional view of a semiconductor laser according to an embodiment of the invention. As shown in FIG. 8A, an Si doped n-type GaAs substrate 1 has a main plane offset by 10 degrees in the direction from the plane (100) to the plane (111)A.

Figure 8B:
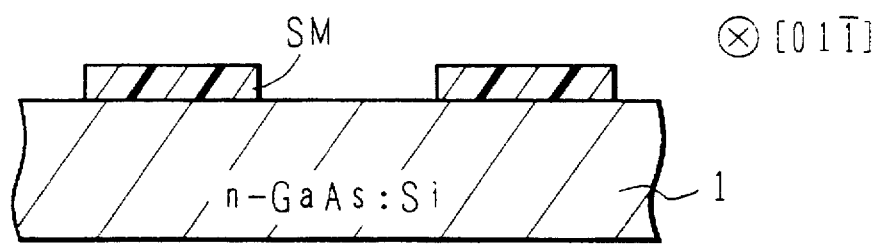

As shown in FIG. 8B, on the surface of the n-type GaAs substrate 1, photoresist masks SM extending in the direction [01$\bar{1}$] are formed. The width of each photoresist mask is 150 µm, and a distance between the photoresist masks is 150 µm.

Figure 8C:
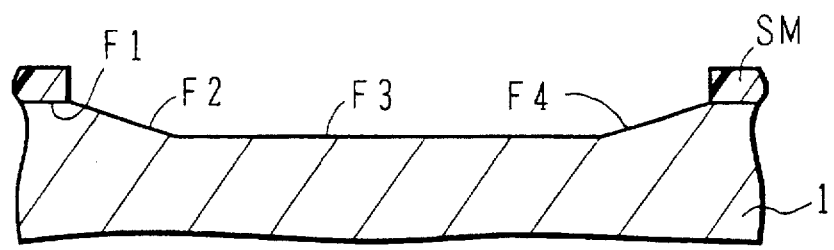

As shown in FIG. 8C, by using the photoresist masks SM as etching masks, a step of about 0.5 µm is formed by HF based solution to set an angle between the main planes F1 and F3 and the slant planes F2 and F4 of the substrate 1 to about 15 to 20 degrees. The crystal plane of the slant plane F2 is a plane intermediate between the plane (411)A and the plane (211)A.

Figure 8D:
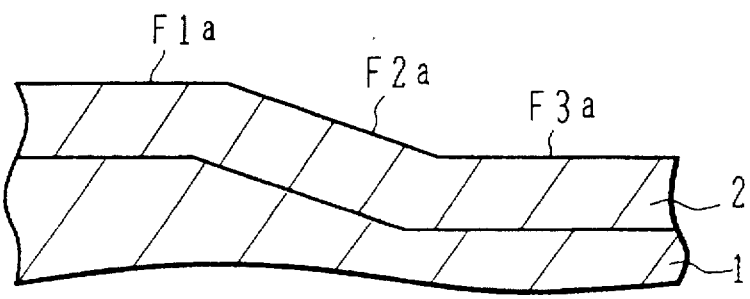

As shown in FIG. 8D, on the stepped substrate 1 with the slant planes, an n-type GaAs buffer layer 2 is formed to a thickness of 1 µm or more to form a slant plane F2$a$ having the plane (411)A. With the substrate off-angle of 10 degrees, the angle between the slant plane F2$a$ and flat planes F1$a$ and F3$a$ is about 10 degrees.

Returning back to FIG. 7, on the Si doped GaAs substrate 1 having an impurity concentration of about $4 \times 10^{18}$ cm$^{-3}$, a GaAs buffer layer 2 having an n-type impurity concentration of about $5 \times 10^{17}$ cm$^{-3}$ is grown to a thickness of 1.5 μm by MOVPE at 670° C., by using as source gases trimethylgallium (TMG) and arsine (AsH$_3$) and as dopant Si$_2$H$_6$, at a V/III ratio of 100, and at a growth rate of 1 μm/hour.

Next, by gently changing the growth temperature from 670° C. to 710° C., a Ga$_{0.5}$In$_{0.5}$P intermediate layer 3 having an n-type impurity concentration of about $1 \times 10^{18}$ cm$^{-3}$ is grown to a thickness of 0.1 μm, by using as source gases triethylgallium (TEG), trimethylindium (TMI), and phosphine (PH$_3$) and as dopant Si$_2$H$_6$, at a V/III ratio of 500, and at a growth rate of 1 μm/hour.

Next, an n-type (Al$_{0.7}$Ga$_{0.3}$)$_{0.5}$In$_{0.5}$P cladding layer 4 having an n-type impurity concentration of about $5 \times 10^{17}$ cm$^{-3}$ is grown to a thickness of 2.0 μm, by using as a source gas trimethylaluminum (TMA), TEG, TMI, and PH3 and as dopant Si$_2$H$_6$, at a V/III ratio of about 330, and at a growth rate of 2 μm/hour. The crystal plane of the slant plane of the n-type AlGaInP cladding layer 4 is a plane intermediate between the plane (411)A and the plane (511)A, the angle between the slant plane and the flat plane is about 9 degrees, and the width of the slant plane is about 3 μm.

Next, a strained MQW active layer 5 is grown at a growth temperature of 710° C. As shown in FIG. 9A, the strained MQW active layer 5 is formed by alternately laminating a guide (barrier) layer 5a of (Al$_{0.4}$Ga$_{0.6}$)$_{0.5}$In$_{0.5}$P and a quantum well layer 5b of Ga$_{0.44}$In$_{0.56}$As$_{0.08}$P$_{0.92}$. The quantum well layer 5b has a distortion of about 1%. The guide layer 5a having a thickness of 5 nm is grown four layers, and the quantum well layer 5b having a thickness of 6 nm is grown three layers.

On the active layer 5, a first cladding layer 6 of p-type (Al$_{0.7}$Ga$_{0.3}$)$_{0.5}$In$_{0.5}$P having a p-type impurity concentration of about $6 \times 10^{17}$ cm$^{-3}$ at a slant portion and a impurity concentration of about $1.5 \times 10^{17}$ cm$^{-3}$ at a flat portion is grown to a thickness of 0.4 μm, by using as source gases TMA, TEG, TMI, and PH$_3$ and as dopant dimethylzinc (DMZn), at a V/III ratio of 330, and at a growth rate of 2 μm/hour.

A cladding and blocking layer 7 of (Al$_{0.7}$Ga$_{0.3}$)$_{0.5}$In$_{0.5}$P is grown to a thickness of 0.45 μm at a growth temperature of 710° C., by alternately doping DMZn and H$_2$S dopants each to a thickness of 15 nm for 15 periods, and by using as source gases TMA, TEG, TMI, and PH$_3$, at a V/III ratio of 330, and at a growth rate of 2 μm/hour.

Referring to FIG. 9B, a p-type thin layer doped with Zn has a p-type impurity concentration of about $6 \times 10^{17}$ cm$^{-3}$ at a slant portion and a p-type impurity concentration of about $3 \times 10^{17}$ cm$^{-3}$ at a flat portion. An n-type thin layer doped with S has an n-type impurity concentration of about $1.4 \times 10^{17}$ cm$^{-3}$ at a slant portion and an n-type impurity concentration of about $6 \times 10^{17}$ cm$^{-3}$ at a flat portion. Therefore, a p$^-$-type layer and an n$^+$-type layer are laminated one upon another at the flat portion, and a p$^+$-type layer and an n$^-$-type layer are laminated one upon another at the slant portion. At the slant portion, Zn diffuses and moves to the n$^-$-type layer doped with S. The p-type impurity concentration of about $6 \times 10^{17}$ cm$^{-3}$ at the slant portion is a impurity concentration after such diffusion.

If Se is used as n-type dopant, the impurity concentration in the slant portion becomes about $2.4 \times 10^{17}$ cm$^{-3}$ and that in the flat portion becomes about $6 \times 10^{17}$ cm$^{-3}$.

In order to obtain a high crystal plane dependency, it is more preferable to use S as n-type dopant than Se.

Instead of forming the cladding and blocking layer 7 by alternately doping p- and n-type impurities, these impurities may be doped at the same time as illustrated in FIG. 9C. In this case, p- and n-type impurities are uniformly distributed in the flat and slant portions. By compensation, the flat portion becomes of an n-type, and the slant portion becomes of a p-type. If Cd is used as p-type impurity, a higher crystal plane dependency can be obtained than using Zn.

On the cladding and blocking layer 7, a third cladding layer 8 of p-type (Al$_{0.7}$Ga$_{0.3}$)$_{0.5}$In$_{0.5}$P having a p-type impurity concentration of about $9 \times 10^{17}$ cm$^{-3}$ at a slant portion and a p-type impurity concentration of about $2.3 \times 10^{17}$ cm$^{-3}$ at a flat portion is grown to a thickness of 1.15 μm, by using as source gases TMA, TEG, TMI, and PH$_3$ and as dopant dimethylzinc (DMZn), at a V/III ratio of 330, and at a growth rate of 2 μm/hour.

On the third p-type cladding layer 8, a p-type Ga$_{0.5}$In$_{0.5}$P intermediate layer 9 having a p-type impurity concentration of about $1 \times 10^{18}$ cm$^{-3}$ at a slant portion is grown to a thickness of 0.1 μm, by gently lowering the growth temperature from 710° to 670° C., by using as source gases TEG, TMI, and PH$_3$ and as dopant dimethylzinc (DMZn), at a V/III ratio of 500, and at a growth rate of 1 μm/hour.

Lastly, a p-type GaAs contact layer 10 having a p-type impurity concentration of about $2 \times 10^{18}$ cm$^{-3}$ at a slant portion is grown to a thickness of 1 μm, by using as source gases TMG and AsH$_3$ and as dopant dimethylzinc (DMZn), at a V/III ratio of 100, at a growth rate of 1 μm/hour, and at a growth temperature of 670° C.

After a series of MOVPE growth processes described above, the semiconductor substrate is dismounted from the growth system. Grooves for isolating at least the p-type regions are formed, with an isolation width of 100 μm. A laminated layer of Au, Ge, and Au is vapor-deposited as an n-side electrode 21, and a laminated layer of AuZn and Au is vapor-deposited as a p-side electrode 22. Thereafter, the wafer is cleaved into chips having a width of 300 μm and a length of 700 μm, and each chip is bonded to a heat sink disposing the p-type region downward.

The reason of doping Si in the n-type cladding layer is that it is desired not to lower the n-type impurity concentration in the slant portion than the substrate. If Cd is used as dopant of the p-type cladding layer, a resistivity can be lowered further.

Semiconductor lasers having various angles θ between the flat portion and slant portion of the active layer 5 were manufacture and their characteristics were checked. Semiconductor lasers having an angle of 12 degrees or less between the active layer flat and slant portions could emit light of a single peak as shown in FIG. 10.

Figure 10:
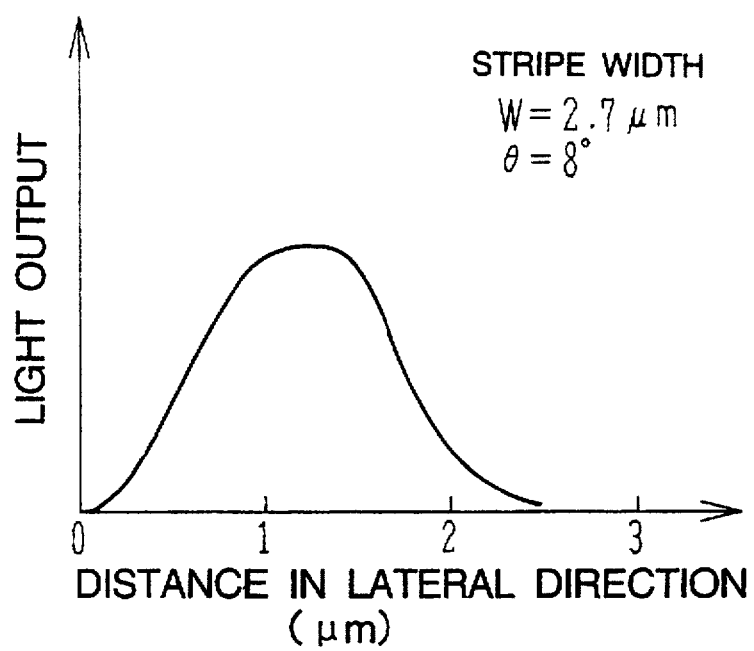
FIG. 10 is a graph showing an example of a light output distribution of the semiconductor laser shown in FIG. 7.

FIG. 10 shows a light output distribution of lasers having a stripe width W of 2.7 μm and the angle of 8 degrees between the active layer flat and slant portions. If the angle between the active layer flat and slant portions is set smaller than 12 degrees, a single peak at the near field can be obtained even if the active layer slant portion has a width of 2.5 μm or more. If the width is about 2.5 to 3 μm, the angle of 12 degrees or less is sufficient. It is preferable, however, to set the angle to 3 degrees or larger. If the angle between the active layer flat and slant portions is to be set to 12 degrees or less, it is desirable to set the substrate off-angle to 8 degrees or more in the direction from the plane (100) to the plane (111)A.

It is supposed that if the angle between the active layer flat and slant portions is set to 12 degrees or less, the crystal planes at the flat and slant portions become close and the composition unevenness in the slant portion can be suppressed. In this case, a large area of the slant portion as the effective active layer is available so that a large light spot diameter, a large COD level, and a high light output can be obtained with ease.

Even if the angle between the active layer flat and slant portions is set to 12 degrees or less, it is possible to sufficiently lower the resistance of the p-type cladding layer in the cladding and blocking layer and form the n-type blocking layer, by using S having a high crystal plane dependency as n-type impurities.

The above embodiment uses AlGaInP/GaAs based semiconductor lasers. The phenomena described above are supposed to be widely applied to group III-V compound semiconductor. Therefore, the invention is applicable to other III-V compound semiconductor materials such as GaAs/AlGaAs based semiconductor materials.

In order to facilitate the understanding of another embodiment of the invention, a conventional technology and the previous studies made by the inventor will be described first.

Figure 17:
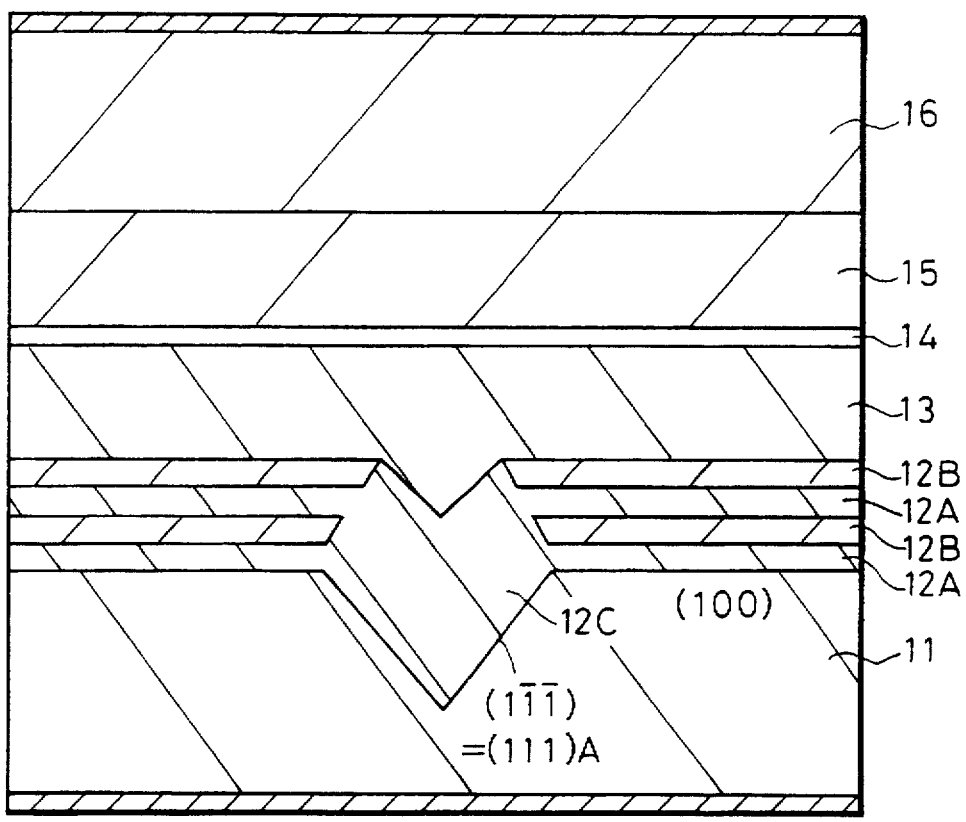
FIG. 17 is a schematic cross sectional view showing the structure of a conventional semiconductor laser.

It is difficult for the semiconductor laser having the structure shown in FIG. 17 to uniformly emit light at the V-groove region as the effective active layer. Not only the plane (111)A but also other various crystal planes appear on the bottom apex of the V-groove. From this reason, in order to realize uniform doping in the V-groove, it is necessary to increase the concentration of p-type dopant and enhance diffusion of the dopant.

However, if the p-type dopant concentration is increased so high as to realize uniform doping in the V-groove, empty lattices appear as impurities diffuse. Empty lattices (vacancies) become non-radiative centers, lowering the efficiency of a semiconductor laser and shortening its life time.

The above problems result from a formation of an effective active layer by using a V-groove.

Figure 11:
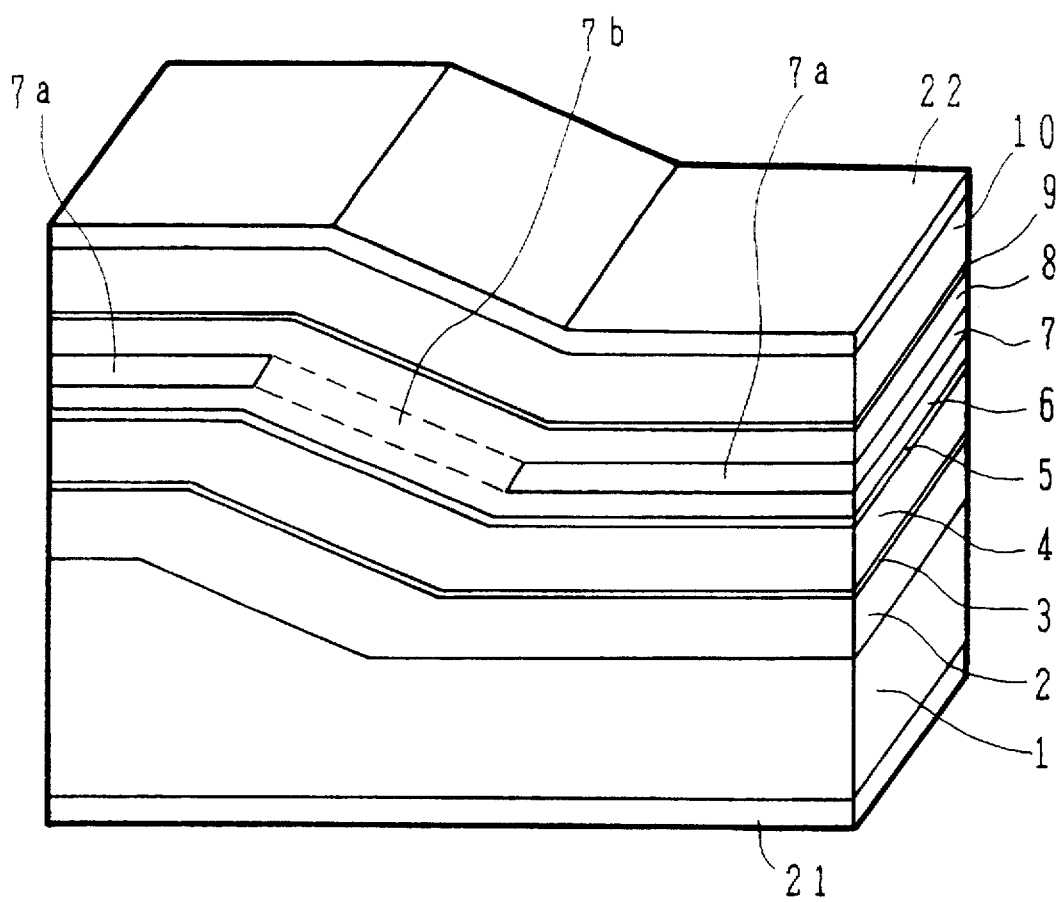
FIG. 11 is a perspective view of a semiconductor laser according to another embodiment of the invention.

FIG. 11 is a perspective view of a semiconductor laser, manufactured by a previous proposal made by the inventors, and according to another embodiment of the invention. A GaAs substrate 1 has a main plane offset by 6 degrees in the direction from the plane (100) to the plane (111)A and is doped with Si to an impurity concentration of $4 \times 10^{18}$ cm$^{-3}$. A step is formed on the main plane of the GaAs substrate, and the slant plane at the step has the plane (411)A. This slant plane extends in the direction [01$\bar{1}$], and the height of the step is about 0.5 μm.

On the n-type GaAs substrate 1, an n-type GaAs buffer layer 2 is being formed to a thickness of about 1.5 μm. Si as n-type dopant is being doped in the GaAs buffer layer 2 at a concentration of about $5 \times 10^{17}$ cm$^{-3}$.

On the n-type GaAs buffer layer 2, a Ga$_{0.5}$In$_{0.5}$P intermediate layer 3 is being formed to a thickness of about 0.1 μm. The Ga$_{0.5}$In$_{0.5}$P intermediate layer 3 is being doped with Si as n-type dopant at a concentration of about $1 \times 10^{18}$ cm$^{-3}$.

This intermediate layer 3 has an intermediate band gap between the underlie GaAs layer and an upper (Al$_{0.7}$Ga$_{0.3}$)$_{0.5}$In$_{0.5}$P layer, and has a function of relaxing a potential barrier by a heterojunction.

On the intermediate layer 3, an n-type (Al$_{0.7}$Ga$_{0.3}$)$_{0.5}$In$_{0.5}$P cladding layer 4 is being formed to a thickness of about 2.0 μm. This cladding layer 4 is being doped with Si as n-type dopant at a concentration of about $5 \times 10^{17}$ cm$^{-3}$. A strained MQW active layer 5 is being formed on the n-type cladding layer 4.

As shown in FIG. 9A, this strained MQW active layer 5 is being formed by alternately laminating a light guide (potential barrier) layer 5a of (Al$_{0.4}$Ga$_{0.6}$)$_{0.5}$In$_{0.5}$P and a light emission quantum well layer 5b of Ga$_{0.44}$In$_{0.56}$As$_{0.08}$P$_{0.92}$. The guide layer 5a having a thickness of about 5 nm is grown four times, and the quantum well layer 5b having a thickness of about 6 nm is grown three times. The active layer 5 is being undoped.

On the active layer 5, a first cladding layer 6 of p-type (Al$_{0.7}$Ga$_{0.3}$)$_{0.5}$In$_{0.5}$P is being formed to a thickness of about 0.4 μm. The first p-type cladding layer 6 is being doped with Zn as p-type dopant.

Figure 15:
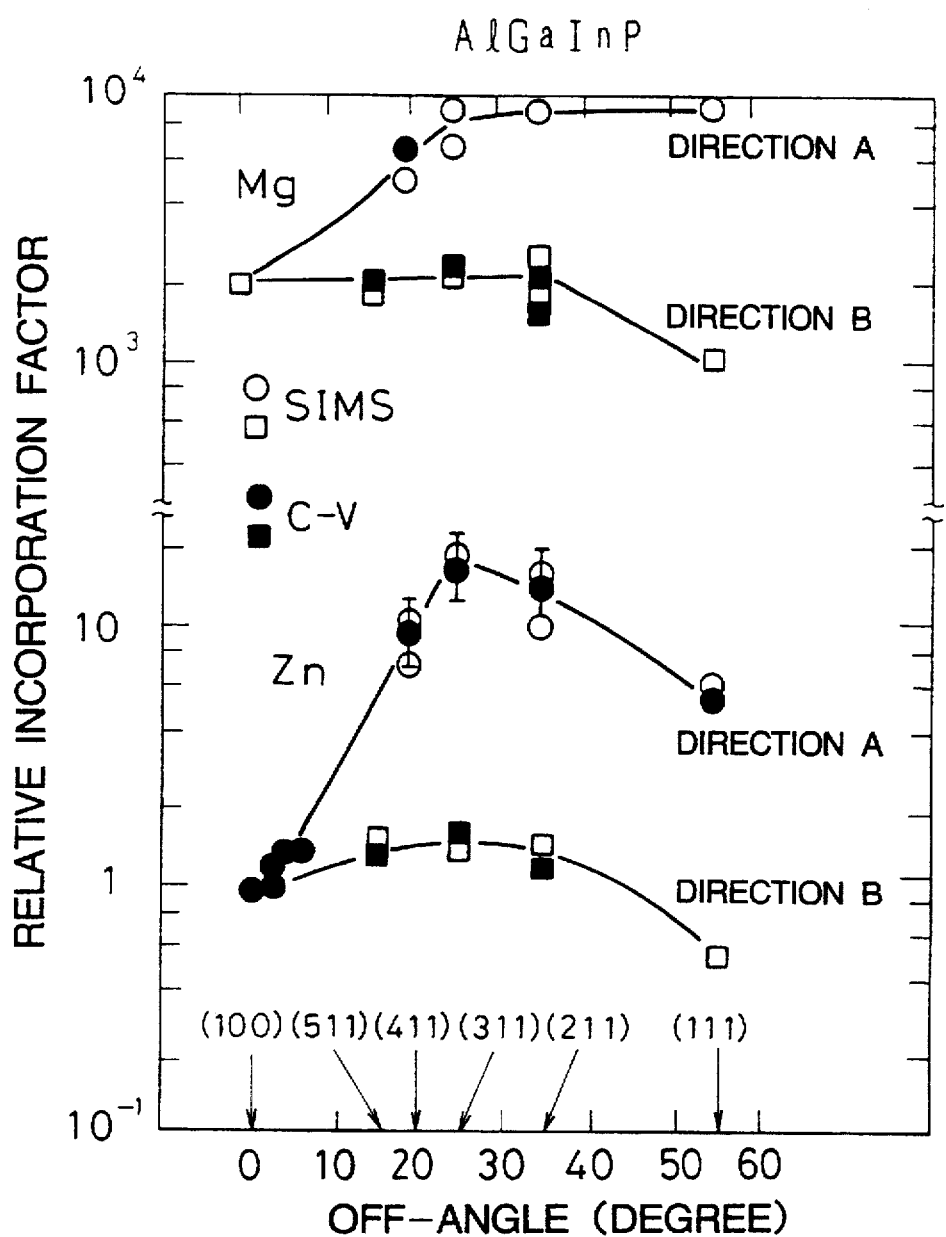
FIG. 15 is a graph showing a crystal plane dependency of incorporation factors of p-type impurities Mg and Zn in AlGaInP.

As shown in FIG. 15, the incorporation factor or probability of p-type dopant Zn changes greatly with a crystal plane. The slant portion has the plane (411)A and the main plane is slightly offset in the direction from the plane (100) to the plane (111)A. Therefore, the impurity concentration in the first p-type cladding layer 6 becomes very different between the slant and flat portions.

Zn is being doped so as to set the p-type impurity concentration to about $6 \times 10^{17}$ cm$^{-3}$ at the slant portion. The p-type impurity concentration at the main plane is about $1 \times 10^{17}$ cm$^{-3}$.

On the first p-type cladding layer 6, a cladding and blocking layer 7 of (Al$_{0.7}$Ga$_{0.3}$)$_{0.5}$In$_{0.5}$P is being formed.

According to the previous proposal made by the inventors, Zn and Se are doped in the cladding and blocking layer 7 at the same time.

Figure 16:
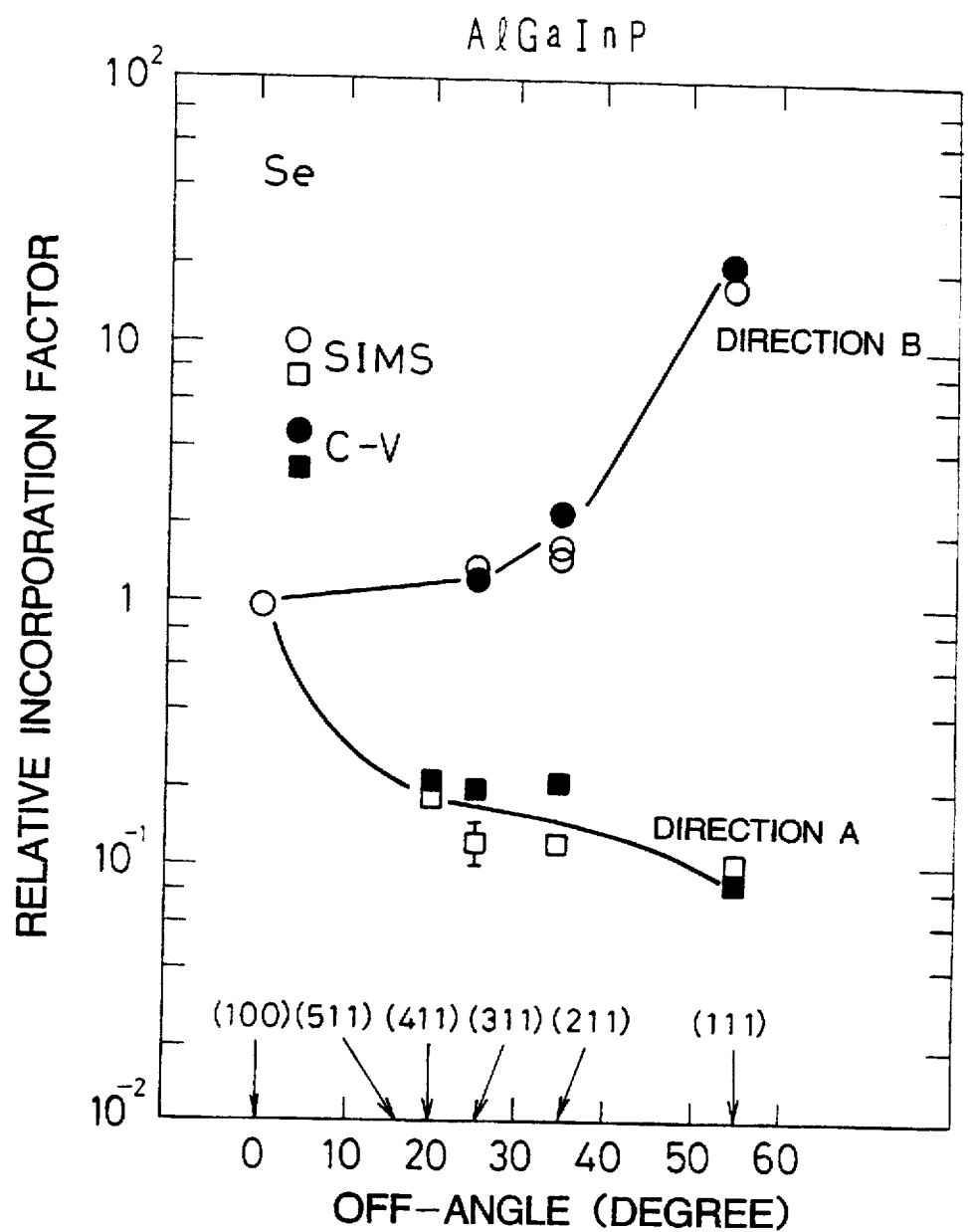
FIG. 16 is a graph showing a crystal plane dependency of incorporation factors of n-type impurities Se in AlGaInP.

FIGS. 15 and 16 show crystal plane dependencies of an incorporation factor of Zn and Se in crystals. The Zn incorporation factor is low at the plane (100) and high at the plane (111)A and other planes. Conversely, the Se incorporation factor is high at the plane (100) and low at the plane (111)A and other planes. Accordingly, as shown in FIG. 2, an n-type region can be formed at the flat portion and a p-type region can be formed at the slant portion, by simultaneous doping of Zn or Se or other doping. However, since Zn and Se are doped at the same region, ZnSe may be formed when they are bonded.

Figure 12:
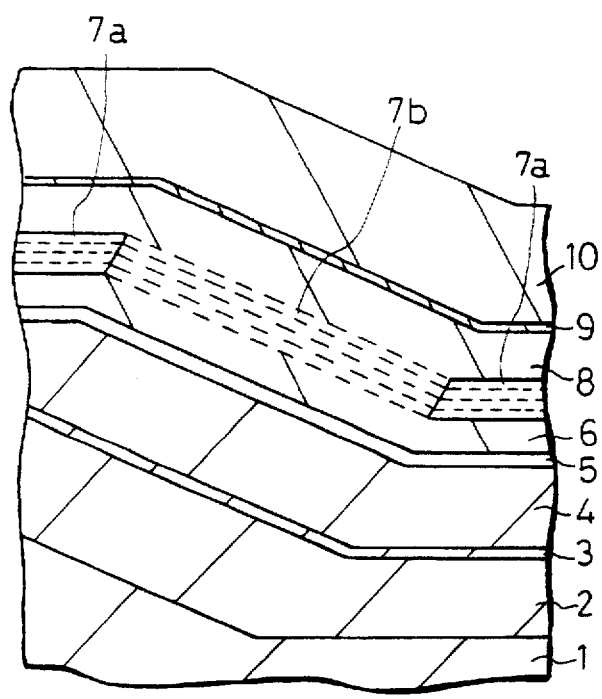
FIG. 12 is a partially enlarged cross sectional view of the semiconductor laser shown in FIG. 11.

In this embodiment, as shown in FIG. 12, the cladding and blocking layer 7 is formed by a laminated layer of four layers or more. Specifically, as shown in FIG. 9B, p-type thin layers p1, p2, . . . doped with Zn as p-type dopant and n-type thin layers n1, n2, . . . doped with S as n-type dopant are alternately laminated one upon another.

As shown in FIG. 15, Zn has a high incorporation factor at the slant portion and a low incorporation factor at the main plane. Therefore, the p-type dopant concentration is high at the slant portion of the p-type thin layer, and low at the main plane.

Conversely, n-type dopant S has a high incorporation factor at the main plane and a low incorporation factor at the slant portion. The crystal plane dependency of an S incorporation factor is higher than that of an Se incorporation factor shown in FIG. 16.

In this embodiment, Ze and S are alternately doped so as to set the p-type impurity concentration to about $6 \times 10^{17}$ cm$^{-3}$ and the n-type impurity concentration to about $1 \times 10^{17}$ cm$^{-3}$ at the slant portion, and to set the p-type impurity concentration to about $2 \times 10^{17}$ cm$^{-3}$ and the n-type impurity concentration to about $8 \times 10^{17}$ cm$^{-3}$ at the main plane (flat portion). Each layer has a thickness of about 5 nm, and laminated by 30 periods. Namely, the whole thickness of the cladding and blocking layer 7 is about 0.3 μm.

Such a structure was investigated at the flat portion by SIMS (secondary ion mass spectrometry) or other measurements, and it has been found that impurity concentrations distribute periodically. However, electrically, the p-type thin layer at the flat portion is depleted, and the flat portion functions as an n-type layer as a whole.

It is supposed that because of a high p-type impurity concentration at the slant portion, the p-type impurities diffuse and the whole slant portion 7b is made a p-type layer. However, it is supposed that the periodical distribution of n-type impurities is left.

Since p- and n-type impurities are doped in different regions, a possibility of bonding is considerably reduced.

If Se is used as n-type dopant in place of S, the Se concentration at the slant portion is about $2 \times 10^{17}$ cm$^{-3}$ and about $8 \times 10^{17}$ cm$^{-3}$ at the main plane. As compared to n-type dopant S, a compensation ratio of p-type impurities to n-type impurities at the slant portion is degraded by about a twofold.

Returning to FIG. 11, the cladding and blocking layer 7 forms an n-type current blocking layer 7a at the main plane and a second p-type cladding layer 7b at the slant portion.

On the cladding and blocking layer 7, a p-type third cladding layer 8 of $(Al_{0.7}Ga_{0.3})_{0.5}In_{0.5}P$ is being formed to a thickness of about 1.15 μm. This third p-type cladding layer 8 is being doped with Zn as p-type dopant and has a p-type impurity concentration of about $9 \times 10^{17}$ cm$^{-3}$.

On the third p-type cladding layer 8, a p-type $Ga_{0.5}In_{0.5}P$ intermediate layer 9 is being formed to a thickness of about 0.1 μm. The p-type intermediate layer 9 is being doped with Zn as p-type dopant and has a p-type impurity concentration of $1 \times 10^{18}$ cm$^{-3}$.

On the p-type intermediate layer 9, a p-type GaAs contact layer 10 is being formed to a thickness of about 1 μm. The p-type contact layer is being doped with Zn as p-type dopant and has a p-type impurity concentration of $2 \times 10^{18}$ cm$^{-3}$.

A laminated layer of Au, Ge, and Au is being formed as an n-side electrode 21 on the bottom of the n-type GaAs substrate, and a laminated layer of AuZn and Au is being formed as a p-side electrode 22 on the top of the p-type contact layer 10.

With the structure described above, since the GaAs buffer layer 2 is formed on the GaAs substrate 1 to a thickness of about 1.5 μm, a stable plane of the plane (411)A is formed at the slant portion. The buffer layer 2 functioning to stabilize the crystal plane at the slant portion has preferably a thickness of about 1.0 μm or more.

Furthermore, since the cladding and blocking layer 7 is formed by a laminated layer of thin layers doped with p-type impurity and thin layers doped with n-type impurity, a probability of bonding of p- and n-type impurities in this layer 7 lowers, and a pairing probability of impurities is greatly lowered. It is therefore possible to form a cladding and blocking layer having less defects and good crystal properties.

Figure 13:
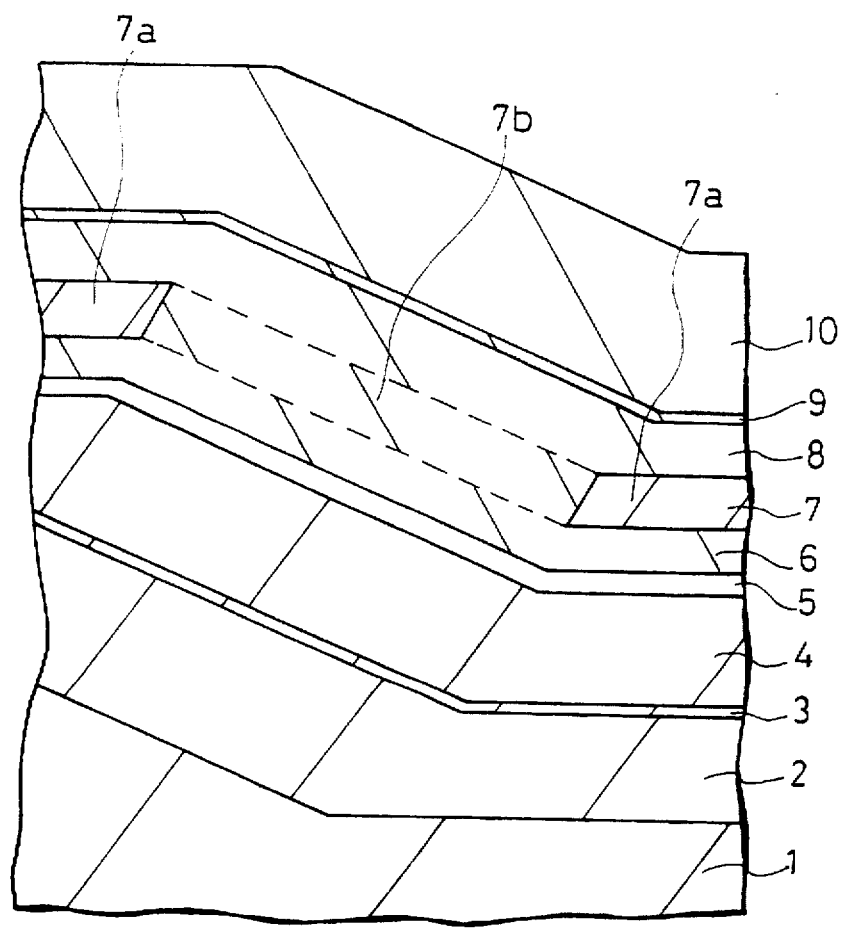
FIG. 13 is a partially enlarged cross sectional view of a semiconductor laser according to a further embodiment of the invention.

FIG. 13 shows the structure of a semiconductor laser according to another embodiment of the invention. Although the structure of a cladding and blocking layer 7 of this embodiment is different from the embodiment shown in FIGS. 11 and 12, the other structures are similar to those of the latter embodiment.

As shown in FIG. 13, the cladding and blocking layer 7 has an n-type current blocking layer 7a at the main plane and a p-type second cladding layer 7b at the slant portion. The cladding and blocking layer 7 is being doped at the same time with Zn or Cd as p-type impurity and S as n-type impurity.

The incorporation factor of Zn increases in the direction from the plane (100) to the plane (411)A as shown at a Zn curve shown in FIG. 15. Cd has a higher crystal plane dependency than Zn. S has a higher crystal plane dependency than Se as shown in FIG. 16, and its incorporation factor quickly reduces in the direction from the plane (100) to the plane (411)A.

Therefore, if S as n-type impurity and Cd or Zn as p-type impurity are doped at the same time, the n-type impurity concentration can be made high at the main plane and the p-type impurity concentration can be made high at the slant portion as shown in FIG. 9C.

Conventionally, Se as n-type impurity and Zn as p-type impurity have been used (refer to FIG. 2).

In the embodiment shown in FIG. 13, since S having a higher incorporation factor than Se is used as n-type impurity, the S concentration at the slant portion can be made lower.

Specifically, the second p-type cladding layer 7b shown in FIG. 9C has a p-type impurity concentration of about $6 \times 10^{17}$ cm$^{-3}$ and an n-type impurity concentration of about $5 \times 10^{16}$ cm$^{-3}$ at the slant portion, and the current blocking layer 7a has a p-type impurity concentration of about $1 \times 10^{17}$ cm$^{-3}$ and an n-type impurity concentration of about $4 \times 10^{17}$ cm$^{-3}$ at the flat portion. In this embodiment, since the simultaneous doping is performed, the cladding and blocking layer 7 is formed as a single layer having a thickness of about 0.3 μm.

If Se is used as n-type impurity in place of S, the impurity concentration at the slant portion becomes about $1 \times 10^{17}$ cm$^{-3}$ and that at the flat portion becomes about $4 \times 10^{17}$ cm$^{-3}$. A compensation ratio of p-type impurity to n-type impurity at the slant portion is degraded by about a twofold.

A method of manufacturing such a semiconductor laser will be described.

Figure 14A:
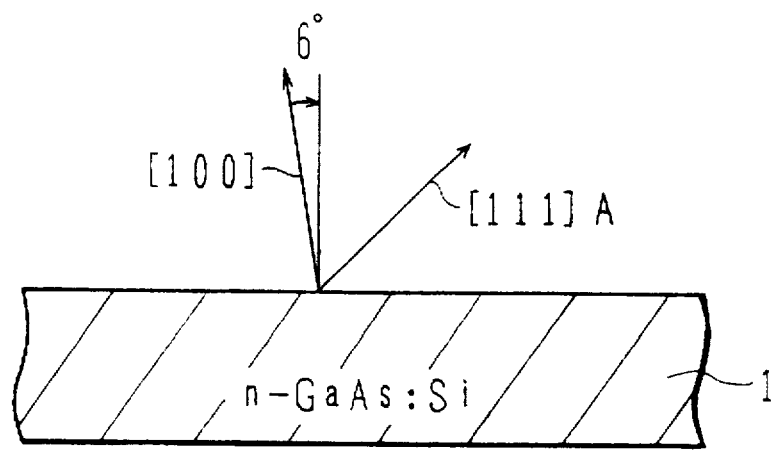
FIGS. 14A and 14B are cross sectional views explaining a method of manufacturing a semiconductor laser according to another embodiment of the invention.

As shown in FIG. 14A, an Si doped n-type GaAs substrate 1 is prepared whose main plane is offset by about 6 degrees in the direction from the plane (100) to the plane (111)A. In FIG. 14, the directions of normal lines of the planes are schematically shown. The direction offset by about 6 degrees from the direction [100] to the direction [111] A is indicated by a normal line of the main plane of the GaAs substrate 1.

Figure 14B:
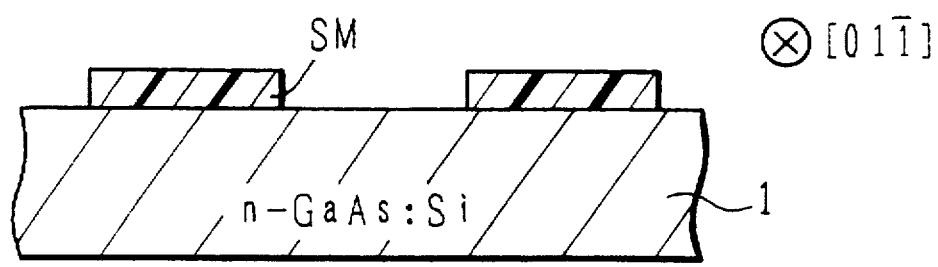

As shown in FIG. 14B, on the surface of the n-type GaAs substrate 1, striped photoresist masks SM are formed extending in the direction [01$\bar{1}$]. The width of each photoresist mask is 150 μm, and a distance between the photoresist masks is 150 μm. The period of 300 μm of photoresist masks corresponds to the lateral width of a semiconductor laser. FIG. 14B shows the structure similar to that shown in FIG. 8B. In the following, the manufacturing method will be described with reference to FIGS. 8C to 8D.

As shown in FIG. 8C, by using the photoresist masks SM as etching masks, the surface of the GaAs substrate 1 is etched to a depth of about 0.5 μm by HF based solution. The central area not covered with the photoresist mask SM is etched uniformly, but the interface region with the photoresist mask SM is formed with slant portions. Specifically, a broad flat plane F3 is formed at the central area between the photoresist masks, and slant portions F2 and F4 are formed on both sides of the central portion.

The slant plane F2 is inclined by about 14 degrees relative to the flat plane F3. Since the main plane of the GaAs substrate 1 is offset by 6 degrees relative to the plane (100), the slant plane F2 is inclined by about 20 degrees relative to the plane (100). The crystal plane of the slant plane is near the plane (411)A. Immediately after etching, however, the slant plane has other crystal planes.

After etching, the photoresist masks SM are removed, and epitaxial growth is performed on the stepped substrate surface. Epitaxial growth is executed all by MOVPE. The growth pressure is set to 50 Torr, a growth efficiency is set to 800 μm/mol, a total flow rate is set to 8 slm, and hydrogen is used as a carrier gas.

As shown in FIG. 8D, on the n-type GaAs substrate 1, an n-type GaAs buffer layer 2 having an n-type impurity concentration of about $5 \times 10^{17}$ cm$^{-3}$ is grown to a thickness of about 1.5 μm at 670° C., by using as source gases trimethylgallium (TMG) and arsine (AsH$_3$) and as dopant Si$_2$H$_6$, at a V/III ratio of 100, and at a growth rate of 1 μm/hour.

As the GaAs buffer layer 2 is grown to a thickness of about 1 μm or more, flat planes F1a and F3a and a slant plane F2a appear on the surface of the buffer layer 2, in accordance with the underlie crystal planes and steps. As the buffer layer 2 is further grown, the slant plane F2a has a stable plane of the plane (411)A.

After the buffer layer 2 is grown, other layers shown in FIG. 11 are grown. By gently changing the growth temperature from 670° C. to 710° C., an intermediate layer 3 having an n-type impurity concentration of about $1 \times 10^{18}$ cm$^{-3}$ is grown to a thickness of 0.1 μm, by using as source gases triethylgallium (TEG), trimethylindium (TMI), and phosphine (PH$_3$) and as dopant Si$_2$H$_6$, at a V/III ratio of 500, and at a growth rate of 1 μm/hour.

An n-type cladding layer 4 having an n-type impurity concentration of about $5 \times 10^{17}$ cm$^{-3}$ is grown to a thickness of about 2.0 μm, by using as a source gas trimethylaluminum (TMA), TEG, TMI, and PH$_3$ and as dopant Si$_2$H$_6$, at a V/III ratio of about 330, and at a growth rate of 2 μm/hour.

A strained MQW active layer 5 is grown at a growth temperature of 710° C. by alternately exchanging source gases. The strained MQW active layer 5 is formed by alternately laminating a guide (barrier) layer of $(Al_{0.4}Ga_{0.6})_{0.5}In_{0.5}P$ and a quantum well layer of $Ga_{0.44}In_{0.56}As_{0.08}P_{0.92}$. The quantum well layer 5b has a distortion of about 1%. The guide layer having a thickness of 5 nm is grown four times, and the quantum well layer having a thickness of 6 nm is grown three times. The guide layer is grown at a V/III ratio of 400 and a growth speed of 1 μm/hour, and the quantum well layer is grown at a V/III ratio of 500 and at a growth speed of 1 μm/hour.

A first p-type cladding layer 6 having a p-type impurity concentration of about $6 \times 10^{17}$ cm$^{-3}$ at a slant portion is grown to a thickness of 0.4 μm and a impurity concentration of $1 \times 10^{17}$ cm$^{-3}$ at the flat plane at a temperature of 710° C., by using as source gases TMA, TEG, TMI, and PH$_3$ and as dopant dimethylzinc (DMZn), at a V/III ratio of 330, and at a growth rate of 2 μm/hour.

A cladding and blocking layer 7 of $(Al_{0.7}Ga_{0.3})_{0.5}In_{0.5}P$ is formed at a growth temperature of 710° C. by alternately doping DMZn and H$_2$S dopants to grow a Zn doped layer having a thickness of 5 nm and an S doped layer having a thickness of 5 nm for 30 periods and by using as source gases TMA, TEG, TMI, and PH$_3$, at a ratio V/III of 330, and at a growth rate of 2 μm/hour.

The doping is controlled to set the p-type impurity concentration to about $6 \times 10^{17}$ cm$^{-3}$ and the n-type impurity concentration to about $1 \times 10^{17}$ cm$^{-3}$ at the slant portion. At the flat plane, the p-type impurity concentration is about $2 \times 10^{17}$ cm$^{-3}$ and the n-type impurity concentration is about $8 \times 10^{17}$ cm$^{-3}$.

It is supposed however that p-type impurities in the slant portion diffuse and form a uniform impurity concentration. Therefore, the p-type impurity concentration in the slant portion is a half of the actual dope of about $1.2 \times 10^{18}$ cm$^{-3}$.

A third p-type cladding layer 8 of p-type $(Al_{0.7}Ga_{0.3})_{0.5}In_{0.5}P$ having a p-type impurity concentration of about $9 \times 10^{17}$ cm$^{-3}$ at a slant portion and a p-type impurity concentration of about $1.5 \times 10^{17}$ cm$^{-3}$ at a flat portion is grown to a thickness of 1.15 μm, by using as source gases TMA, TEG, TMI, and PH$_3$ and as dopant dimethylzinc (DMZn), at a V/III ratio of 330, and at a growth rate of 2 μm/hour.

A p-type $Ga_{0.5}In_{0.5}P$ intermediate layer 9 having a p-type impurity concentration of about $1 \times 10^{18}$ cm$^{-3}$ at a slant portion is grown to a thickness of about 0.1 μm, by gently lowering the growth temperature from 710° to 670° C., by using as source gases TEG, TMI, and PH$_3$ and as dopant dimethylzinc (DMZn), at a V/III ratio of 500, and at a growth rate of 1 μm/hour.

A p-type GaAs contact layer 10 having a p-type impurity concentration of about $2 \times 10^{18}$ cm$^{-3}$ at a slant portion is grown to a thickness of 1 μm, by using as source gases TMG and AsH$_3$ and as dopant dimethylzinc (DMZn), at a V/III ratio of 100, at a growth rate of 1 μm/hour, and at a growth temperature of 670° C.

With a series of epitaxial growth processes described above, an epitaxial lamination constituting the laser structure on the GaAs substrate 1 can be grown continuously.

Thereafter, grooves of 100 μm width are formed in the wafer, leaving the laser structure, and elements are separated. Next, a laminated layer of Au, Ge, and Au is vapor-deposited as an n-side electrode 21 on the bottom of the GaAs substrate 1, and a laminated layer of AuZn and Au is vapor-deposited as a p-side electrode 22 on the top of the p-type contact layer 10.

Thereafter, the wafer is cleaved into chips having a width of 300 μm and a length of 700 μm, and each chip is bonded to a heat sink disposing the p-type region downward.

In the case of the semiconductor laser shown in FIG. 13, the cladding and blocking layer 7 of p-type $(Al_{0.7}Ga_{0.3})_{0.5}In_{0.5}$ having an p-type impurity concentration of about $6 \times 10^{17}$ cm$^{-3}$ and an n-type impurity concentration of about $5 \times 10^{16}$ cm$^{-3}$ at the slant portion is grown to a thickness of 0.3 μm at a growth temperature of 710° C. by doping DMZn and H$_2$S dopants at the same time and by using as source gases TMA, TEG, TMI, and PH$_3$, at a V/III ratio of 330, and at a growth rate of 2 μm/hour. At the flat portion, the p-type impurity concentration is about $1 \times 10^{17}$ cm$^{-3}$ and the n-type impurity concentration is about $4 \times 10^{17}$ cm$^{-3}$ at the flat portion.

The semiconductor layer manufactured as above has no bending portion in the light emitting effective active layer, and the cladding and blocking layer has also no bending portion and has a similar shape to that of the active layer.

Therefore, by doping the cladding and blocking layer with impurities having incorporation factors depending on the crystal plane, it is possible to uniformly dope the cladding layer region and the blocking layer region. A uniform doping suppresses a need of increasing impurity concentrations.

If p-type impurities are alternately doped in the cladding and blocking layer, coupling between p- and n-type impurities reduces so that a probability of pairing can be efficiently lowered.

If p- and n-type impurities whose incorporation factors change greatly with a crystal plane are used, even if p- and n-type impurities are doped at the same time, coupling between p- and n-type impurities reduces so that a probability of pairing can be efficiently lowered.

If S having a very high crystal plane dependency is used, pairing between impurities can be efficiently lowered. Although Zn and Cd can be used as p-type impurities, if Cd having a higher crystal plane dependency is used, pairing between impurities can be efficiently lowered.

Also in the case of alternate doping, if doping sources such as S and Cd having a high crystal plane dependency are used, a compensation ratio after diffusion can be lowered, and a small resistivity lateral pn junction can be formed even at a relatively low concentration doping.

If a thickness of each layer doped alternately is set to about 10 nm or less, a uniform impurity concentration in the laminated layer can be realized because of a spreading of a carrier wave function.

Namely, it is conceivable that carriers are diffused uniformly over the whole laminated layer. As compared to a thick layer, a small resistivity lateral pn junction can therefore be formed by a relatively low concentration doping.

In the above description, an AlGaInP based group III-V compound semiconductor epitaxial layer is formed on a GaAs substrate. A group III-V compound semiconductor usable is not limited thereto. For example, InP, and other compounds may be used for a substrate instead of GaAs. As materials of the cladding layer and other layers formed on a substrate, AlGaAs, GaInP, InP, and AlInAs may be used. A substrate of a mixed crystal composition or group III-V compound semiconductor having four elements or more may also be used.

In the semiconductor laser shown in FIG. 11, current moving downward from the p-side electrode 22 passes through the p-type regions 10, 9, and 8, and reaches the cladding and blocking layer 7. The cladding and blocking layer 7 has the n-type regions 7a which form a potential barrier of hole current and confine hole current in the p-type region 7b at the center of the cladding and blocking layer 7. The current flowing through the slant portion causes light to be emitted from the slant portion of the active layer 5.

This slant plane light emission type semiconductor laser is not of a loss guide structure (a waveguide formed by absorption region) so that light absorption and loss are not required to be taken into account. Since a laminated structure on the substrate can be grown by a series of MOVPE processes, semiconductor lasers can be manufactured at a high yield and a low cost. There is another advantage of a low astigmatism.

The cladding and blocking layer 7 has the n-type region at the main plane and the p-type region at the slant plane, because as described earlier the p-type impurity (such as Zn) incorporation factor has a crystal plane dependency of (311)A>(100) and the n-type impurity (such as Se) incorporation factor has an opposite crystal dependency of (100)>(311)A. Accordingly, if p- and n-type impurities are doped at the same time in the surface of a semiconductor layer having different crystal planes, it is possible to grow p-type and n-type regions at the same time.

For example, If p- and n-type impurities are doped at the same time in the surface of a stepped substrate having a main plane of the plane (100) and a slant plane of the plane (311)A, n-type regions are formed on the main plan and a p-type region is formed on the slant plane.

With such a technology, a good lateral pn junction can be formed and the performance of grown crystals is good. It is however necessary for an automatic growth of a lateral pn junction to dope p- and n-type impurities at the same time or alternately. Specifically, the p-type region formed on the slant portion is doped also with n-type impurities. As compared to the p-type impurity concentration, an effective p-type impurity concentration contributing to a conductivity lowers correspondingly, and the resistivity of the p-type region of the cladding and blocking layer becomes higher than other p-type cladding layers.

In order to lower a series resistance of a semiconductor laser, it is desirable to make the cladding and blocking layer 7 as thin as possible.

If the cladding and blocking layer 7 is made too thin, a depletion layer grown from a pn junction between the n-type region 71 and the underlie first p-type cladding layer 6 lowers the potential barrier of the n-type blocking regions 7a, reducing the current blocking effect. In an extreme case, the n-type region 7a substantially disappears in potential diagram and the current blocking effect is totally lost.

Current confined by the current blocking regions 7a flows also in the lateral direction in the first p-type cladding layer 6 before it reaches the active layer 5. This lateral current flow causes the current flowing in the main plane of the active layer 5 to become a wasteful current, lowering the laser light emission efficiency. In order to reduce this idle current, it is desirable to place the current blocking regions 7a as near the active layer 5 as possible. However, if the current blocking regions 7a are placed too near the active layer 5, the above-described depletion layer grows in the first p-type cladding layer, losing the function of the first p-type cladding layer.

The GaAs buffer 2 has preferably a plane near the plane (411)A at the slant portion. Since group III-V compound semiconductor layers having different compositions are grown on the buffer layer 2, the active layer 5 has a slant plane slightly inclined more than the slant portion surface of the buffer layer 2. The buffer layer 2 and the active layer 5 are therefore not parallel in a strict sense.

The thickness of the n-type cladding layer 4 under the active layer 5 is therefore uneven and different at each position on the slant portion. In the case of light confinement in the perpendicular direction at the slant portion, a change in the thickness of the n-type cladding layer 4 means a different light absorption loss at each position on the slant portion. A different light absorption loss at each position on the slant portion disturbs the light distribution and degrades the characteristics of laser beam.

Also in the third p-type cladding layer 8 on the cladding and blocking layer 7, the p-type impurity concentration becomes different between the main plane and the slant plane.

If p-type impurities having a high crystal plane dependency of the incorporation factor are used, the p-type impurity concentration is high at the slant portion, but lowers at the main plane. Use of such a third p-type cladding layer 8 concentrates current upon the slant portion. A device resistance is therefore increased by the third p-type cladding layer 8.

The inventors have rigorously studied in order to solve each of these issues.

Figure 18:
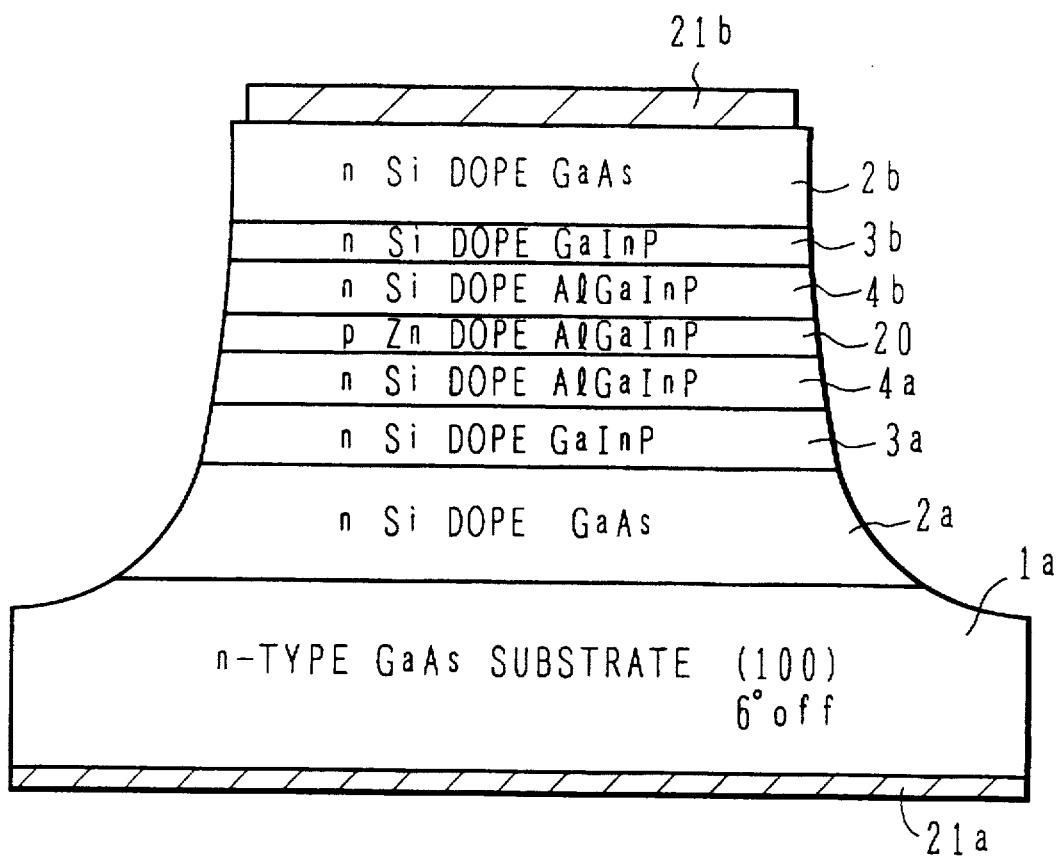
FIG. 18 is a cross sectional view showing the structure of a sample used for studying optimization of the laser structure.

Samples shown in FIG. 18 were manufactured in order to solve the most significant issue associated with the cladding and blocking layer 7 and the first p-type cladding layer 6.

Referring to FIG. 18, on an n-type GaAs substrate 1a offset by about 6 degrees from the plane (100), an Si doped n-type GaAs layer 2a having a thickness of about 0.5 μm, an Si doped n-type GaInP layer 3a having a thickness of about 0.1 μm, and an Si doped n-type AlGaInP layer 4a having a thickness of about 0.3 μm are being laminated in this order.

This laminated structure corresponds to the structure under the active layer shown in FIG. 11.

On these n-type regions, a Zn doped p-type AlGaInP layer 20 is formed, and an n-type laminated structure symmetrical with the lower n-type laminated structure is formed on the layer 20. Namely, on the p-type AlGaInP layer 20, an Si doped n-type AlGaInP layer 4b having a thickness of about 0.3 µm, an Si doped n-type GaInP layer 3b having a thickness of about 0.1 µm, and an Si doped n-type GaAs layer 2b having a thickness of about 0.5 µm are being laminated.

Samples with the p-type AlGaInP layer 20 having thicknesses of about 0.1, 0.2, and 0.3 µm were prepared.

Ohmic electrodes 21a and 21b of a laminated layer of AuGe and Au were formed on the bottom of the GaAs substrate 1a and on the top of the n-type GaAs layer 2b. All Si doped layers were grown at a doping concentration of about $5\times10^{17}$ cm$^{-3}$, and the Zn doped AlGaInP layer 20 were grown at a doping concentration of about $1\times10^{17}$ cm$^{-3}$.

A breakdown voltage of the npn structure was measured by applying a voltage between the electrodes 21a and 21b and measuring a current flowing therethrough. Of the pn junctions formed on both sides of the p-type AlGaInP layer 20, in the pn junction applied with a reverse bias voltage, a depletion layer develops. If this depletion layer develops over the whole region of the p-type AlGaInP layer and the potential barrier formed by the p-type AlGaInP layer 20 is substantially lost, a breakdown voltage of the npn structure becomes zero. The breakdown voltage corresponds to a breakdown voltage of a pn junction between the first p-type cladding layer on the active layer and the n-type current blocking regions.

Measured breakdown voltages of the samples having the thicknesses of 0.1, 0.2, and 0.3 µm were about 0 V, about 1.8 V, and about 6 V, respectively.

From the measurement results, the p-type AlGaInP layer 20 having the thickness of 0.1 µm had a breakdown voltage of 0 V and its function was lost. Both the samples having the p-type AlGaInP layer 20 of 0.2 µm and 0.3 µm showed a practically usable breakdown voltage. As the thickness of the p-type AlGaInP layer 20 is increased, although the breakdown voltage is improved, the above-described increased resistance problem occurs. Therefore, in order to thin the p-type AlGaInP layer 20 while retaining a desired potential barrier, it is preferable to make the p-type AlGaInP layer 20 have a thickness in the range from 0.15 to 0.35 µm.

The sample shown in FIG. 18 simulates the structure of the current blocking regions 71 and the underlying first p-type cladding layer 6 of the slant plane light emission type semiconductor laser shown in FIG. 11. The active layer 5 is very thin so that it can be omitted in such a simulation model. It is therefore preferable to set the thickness of the first p-type cladding layer 6 in the range from 0.15 to 0.35 µm. Similarly, the thickness of the current blocking region 7 is preferably set in the range from 0.15 to 0.35 µm.

In order to reduce a position dependency of light absorption loss upon uneven thickness of the n-type cladding layer 4 at each position of the slant portion, it is sufficient if the thickness of the n-type cladding layer 4 is made larger than the p-type cladding layer. Namely, if the thickness of the n-type cladding layer 4 at the slant portion is made larger than the total thickness of the first p-type cladding layer 6, second p-type cladding layer 7b, and third p-type cladding layer 8, the loss on the side of the p-type cladding layers over the active layer having uniform thicknesses becomes larger than the loss on the underlying n-type cladding layer. As a result, the light loss is determined almost by the p-type cladding layers, and the light absorption loss becomes uniform irrespective of a position on the slant portion. In this case, if the thickness of the p-type cladding layers is sufficient, the light loss becomes a parameter for controlling only the stability of light mode, and if the light mode is controlled by a uniform loss in the p-type cladding layers, light can be emitted uniformly and stably.

At the region above the current blocking regions 7a, it is desirable to connect the p-side electrode 22 to the second p-type cladding region 7b at as low a resistance as possible. If current concentrates only upon the slant portions of the p-type regions 8, 9, and 10, the device resistance increases.

In order to flow current broadly in the third p-type cladding layer 8, it is preferable to dope the third p-type cladding layer with impurities having a low crystal plane dependency of the incorporation factor. If a p-type impurity having a lower crystal plane dependency than generally used Zn is used, the device resistance can be lowered. For example, if Mg is used, current flows sufficiently not only in the slant portion but in the main portion. The crystal plane dependency of an Mg incorporation factor is shown in the upper area of FIG. 15. If the regions above the third p-type cladding layer are doped with Mg, current flows broadly and the device resistance can be lowered.

A slant plane light emission type semiconductor laser incorporating the above-described improvements will be described with reference to FIG. 11.

A GaAs substrate 1 has a main plane offset by 6 degrees in the direction from the plane (100) to the plane (111)A and is doped with Si to an impurity concentration of $4\times10^{18}$ cm$^{-3}$. A step is formed on the main plane of the GaAs substrate 1, and the slant plane at the step has mainly the plane (411)A. This slant plane extends in the direction [01$\bar{1}$], and the height of the step is about 0.5 µm.

On the n-type GaAs substrate 1, an n-type GaAs buffer layer 2 is being formed to a thickness of about 1.5 µm. Si as n-type dopant is being doped in the GaAs buffer layer 2 at a concentration of about $5\times10^{17}$ cm$^{-3}$.

On the n-type GaAs buffer layer 2, a $Ga_{0.5}In_{0.5}P$ intermediate layer is being formed to a thickness of about 0.1 µm. The $Ga_{0.5}In_{0.5}P$ intermediate layer 3 is being doped with Si as n-type dopant at a concentration of about $1\times10^{18}$ cm$^{-3}$.

This intermediate layer 3 has an intermediate band gap between the underlie GaAs layer and an upper $(Al_{0.7}Ga_{0.3})_{0.5}In_{0.5}P$, and has a function of relaxing a potential barrier by a heterojuction.

On the intermediate layer 3, an n-type $(Al_{0.7}Ga_{0.3})_{0.5}In_{0.5}P$ cladding layer 4 is being formed to a thickness of about 3.0 µm. This cladding layer 4 is being doped also with Si as n-type dopant at a concentration of about $5\times10^{17}$ cm$^{-3}$.

The n-type cladding layer 4 has a thickness, which is greater than about 2 µm, and is thicker by about 0.5 µm than the total thickness of 2.45 µm of three p-type cladding layers 6, 7, and 9 to be described below. Therefore, the distribution of light absorption loss is generally uniform at each position, stabilizing the light mode.

On the n-type cladding layer 4, a strained MQW active layer 5 is being formed. As shown in FIG. 9A, this strained MQW active layer 5 is being formed by alternately laminating a light guide (potential barrier) layer 5a of $(Al_{0.4}Ga_{0.6})_{0.5}In_{0.5}P$ and a light emission quantum well layer 5b of $Ga_{0.44}In_{0.56}As_{0.08}P_{0.92}$. The guide layer 5a having a thickness of about 5 nm is grown four times, and the quantum well layer 5b having a thickness of about 6 nm is grown three times. The active layer 5 is being undoped.

On the active layer 5, a first cladding layer 6 of p-type $(Al_{0.7}Ga_{0.3})_{0.5}In_{0.5}P$ is being formed to a thickness of about 0.25 μm. The first p-type cladding layer 6 is being doped with Zn as p-type dopant.

This layer has had a thickness of about 0.4 μm. As described previously, by setting the thickness of the first p-type cladding layer 6 in the range from 0.15 to 0.35 μm, a distance between the active layer 5 and the upper current blocking regions 7a is made sufficiently short while retaining the function of the p-type region.

As shown in FIG. 15, the incorporation factor of p-type dopant Zn changes greatly with a crystal plane. The slant portion has the plane (411)A and the main plane is slightly offset in the direction from the plane (100) to the plane (111)A. Therefore, the impurity concentration in the first p-type cladding layer 6 becomes very different between the slant and flat portions.

Zn is being doped so as to set the p-type impurity concentration to about $6 \times 10^{17}$ cm$^{-3}$ at the slant portion. The p-type impurity concentration at the main plane is about $1 \times 10^{17}$ cm$^{-3}$.

On the first p-type cladding layer 6, a cladding and blocking layer 7 of $(Al_{0.7}Ga_{0.3})_{0.5}In_{0.5}P$ is being formed.

According to the previous proposal made by the inventors, Zn and Se are doped in the cladding and blocking layer 7 at the same time.

FIGS. 15 and 16 show crystal plane dependencies of an incorporation factor of Zn and Se in crystals. The Zn incorporation factor is low at the plane (100) and high at the plane (111)A and other planes. Conversely, the Se incorporation factor is high at the plane (100) and low at the plane (111)A and other planes. Accordingly, as shown in FIG. 2, an n-type region and a p-type region can be formed at the flat portion and the slant portion, respectively, by simultaneous doping of Zn and Se.

In this embodiment, as shown in FIG. 12, the cladding and blocking layer 7 is formed by a laminated layer of four layers or more. Specifically, as shown in FIG. 9B, p-type thin layers p1, p2, . . . doped with Zn as p-type dopants and n-type thin layers n1, n2, . . . doped with S as n-type dopant are alternately laminated one upon another.

As shown in FIG. 15, Zn has a high incorporation factor at the slant portion and a low incorporation factor at the main plane. Therefore, the p-type dopant concentration is high at the slant portion of the p-type thin layer, and low at the main plane.

Conversely, n-type dopant S has a high incorporation factor at the main plane and a low incorporation factor at the slant portion. The crystal plane dependency of an S incorporation factor is higher than that of an Se incorporation factor shown in FIG. 16.

In this embodiment, Ze and S are alternately doped so as to set the p-type impurity concentration to about $6 \times 10^{17}$ cm$^{-3}$ and the n-type impurity concentration to about $1 \times 10^{17}$ cm$^{-3}$ at the slant portion, and to set the p-type impurity concentration to about $2 \times 10^{17}$ cm$^{-3}$ and the n-type impurity concentration to about $8 \times 10^{17}$ cm$^{-3}$ at the main plane (flat portion). Each layer has a thickness of about 5 nm, and layers are laminated by 20 periods. Namely, the whole thickness of the cladding and blocking layer 7 is about 0.2 μm.

By setting the thickness of the cladding and blocking layer 7 in the range from about 0.15 to 0.35 μm, it is possible to sufficiently lower the device resistance while retaining the function of the current blocking region.

Such a structure was investigated at the flat portion by SIMS or other measurements, and it has been found that impurity concentrations distribute periodically. However, electrically, the p-type thin layer at the flat portion is depleted, and the flat portion functions as an n-type layer as a whole.

It is supposed that because of a high p-type impurity concentration at the slant portion, the p-type impurities diffuse and the whole slant portion 7b is made a p-type layer. Specifically, a p-type impurity concentration of $1.2 \times 10^{18}$ cm$^{-3}$ changes to $6 \times 10^{17}$ cm$^{-3}$ doping by diffusion. However, it is supposed that the periodical distribution of n-type impurities is left.

Since p- and n-type impurities are doped in different regions, a possibility of impurity pair formation (pairing) of p- and n-type impurities is considerably reduced.

If Se is used as n-type dopant in place of S, the Se concentration at the slant portion is about $2 \times 10^{17}$ cm$^{-3}$ and about $8 \times 10^{17}$ cm$^{-3}$ at the main plane. As compared to n-type dopant S, a compensation ratio of p-type impurity to n-type impurity at the slant portion is degraded by about a twofold.

Returning back to FIG. 11, the cladding and blocking layer 7 forms an n-type current blocking layer 7a at the main plane and a second p-type cladding layer 7b at the slant portion.

On the cladding and blocking layer 7, a p-type third cladding layer 8 of $(Al_{0.7}Ga_{0.3})_{0.5}In_{0.5}P$ is being formed to a thickness of about 2.20 μm. This third p-type cladding layer 8 is being doped with Mg as p-type dopant and has a p-type impurity concentration of about $9 \times 10^{17}$ cm$^{-3}$ at the slant portion and about $4 \times 10^{17}$ cm$^{-3}$ at the main portion. Mg has a smaller crystal plane dependency of the incorporation factor than Zn. If Zn is used as p-type dopant, the impurity concentration at the main portion becomes about $1.5 \times 10^{17}$ cm$^{-3}$, and current flowing in the main portion reduces.

On the third p-type cladding layer 8, a p-type $Ga_{0.5}In_{0.5}P$ intermediate layer 9 is being formed to a thickness of about 0.1 μm. The p-type intermediate layer 9 is being doped with Zn as p-type dopant and has a p-type impurity concentration of $1 \times 10^{18}$ cm$^{-3}$.

On the p-type intermediate layer 9, a p-type GaAs contact layer 10 is being formed to a thickness of about 1 μm. The p-type contact layer is being doped with Zn as p-type dopant and has a p-type impurity concentration of $2 \times 10^{18}$ cm$^{-3}$.

A laminated layer of Au, Ge, and Au is being formed as an n-side electrode 21 on the bottom of the n-type GaAs substrate, and a laminated layer of AuZn and Au is being formed as a p-side electrode 22 on the top of the p-type contact layer 10.

With the structure described above, since the GaAs buffer layer 2 is formed on the GaAs substrate 1 to a thickness of about 1.5 μm, a stable plane of the plane (411)A is formed at the slant portion. The buffer layer 2 functioning to stabilize the crystal plane at the slant portion has preferably a thickness of about 1.0 μm or more.

Furthermore, since the cladding and blocking layer 7 is formed by a laminated layer of thin layers doped with p-type impurities and thin layers doped with n-type impurities, a probability of coupling or bonding of p- and n-type impurities in this layer 7 lowers, and an impurity pair formation (pairing) probability is greatly lowered. It is therefore possible to form a cladding and blocking layer having less defects and good crystal properties.

The cladding and blocking layer 7 may be formed by simultaneously doping p-type impurity Zn or Cd and n-type impurity S, as explained in conjunction with FIG. 13.

With this structure, since S having a higher incorporation factor than Se is used as n-type impurity, the S concentration at the slant portion can be made lower.

Specifically, the second p-type cladding layer 7b shown in FIG. 9C has a p-type impurity concentration of about $6 \times 10^{17}$ cm$^{-3}$ and an n-type impurity concentration of about $5 \times 10^{16}$ cm$^{-3}$ at the slant portion, and the current blocking layer 7a has a p-type impurity concentration of about $1 \times 10^{17}$ cm$^{-3}$ and an n-type impurity concentration of about $8 \times 10^{17}$ cm$^{-3}$ at the flat portion. In this embodiment, since the simultaneous doping is performed, the cladding and blocking layer 7 is formed as a single layer having a thickness in the range from about 0.15 to 0.35 µm, for example, about 0.2 µm.

If Se is used as n-type impurity in place of S, the impurity concentration at the slant portion becomes about $1 \times 10^{17}$ cm$^{-3}$ and that at the flat portion becomes about $4 \times 10^{17}$ cm$^{-3}$. A compensation ratio of p-type impurity to n-type impurities at the slant portion is degraded by about a twofold.

A method of manufacturing such a semiconductor laser will be described.

As shown in FIG. 14, an Si doped n-type GaAs substrate 1 is prepared whose main plane is offset by about 6 degrees in the direction from the plane (100) to the plane (111)A. In FIG. 14, the directions of normal lines of the planes are schematically shown. The direction offset by about 6 degrees from the direction [100] to the direction [111] A is indicated by a normal line of the main plane of the GaAs substrate 1.

As shown in FIG. 8B, on the surface of the n-type GaAs substrate 1, striped photoresist masks SM are formed extending in the direction [01$\bar{1}$]. The width of each photoresist mask is 150 µm, and a distance between the photoresist masks is 150 µm. The period of 300 µm of photoresist masks corresponds to the lateral width of a semiconductor laser.

As shown in FIG. 8C, by using the photoresist masks SM as etching masks, the surface of the GaAs substrate 1 is etched to a depth of about 0.5 µm by HF based solution. The central area not covered with the photoresist mask SM is etched uniformly, but the interface region with the photoresist mask SM is formed with slant portions. Specifically, a broad flat plane F3 is formed at the central area between the photoresist masks, and slant portions F2 and F4 are formed on both sides of the central portion.

The slant plane F2 is inclined by about 14 degrees relative to the flat plane F3. Since the main plane of the GaAs substrate 1 is offset by 6 degrees relative to the plane (100), the slant plane F2 is inclined by about 20 degrees relative to the plane (100). The crystal plane of the slant plane is near the plane (411)A. Immediately after etching, however, the slant plane has other crystal planes.

After etching, the photoresist masks SM are removed, and epitaxial growth is performed on the stepped substrate surface. Epitaxial growth is executed all by MOVPE. The growth pressure is set to 50 Torr, a growth efficiency is set to 800 µm/mol, a total flow rate is set to 8 slm, and hydrogen is used as carrier gas.

As shown in FIG. 8D, on the n-type GaAs substrate 1, an n-type GaAs buffer layer 2 having an n-type impurity concentration of about $5 \times 10^{17}$ cm$^{-3}$ is grown to a thickness of about 1.5 µm at 670° C., by using as source gases trimethylgallium (TMG) and arsine (AsH$_3$) and as dopant Si$_2$H$_6$, at a V/III ratio of 100, and at a growth rate of 1 µm/hour.

As the GaAs buffer layer 2 is grown to a thickness of about 1 µm or more, flat planes F1a and F3a and a slant plane F2a appear on the surface of the buffer layer 2, in accordance with the underlying crystal planes and steps. As the buffer layer 2 is further grown, the slant plane F2a has a stable plane of the plane (411)A.

After the buffer layer 2 is grown, other layers shown in FIG. 11 are grown. By gently changing the growth temperature from 670° C. to 710° C., an intermediate layer 3 having an n-type impurity concentration of about $1 \times 10^{18}$ cm$^{-3}$ is grown to a thickness of 0.1 µm, by using as source gases triethylgallium (TEG), trimethylindium (TMI), and phosphine (PH$_3$) and as dopant Si$_2$H$_6$, at a V/III ratio of 500, and at a growth rate of 1 µm/hour.

An n-type cladding layer 4 having an n-type impurity concentration of about $5 \times 10^{17}$ cm$^{-3}$ is grown to a thickness of about 3.0 µm, by using as a source gas trimethylaluminum (TMA), TEG, TMI, and PH$_3$ and as dopant Si$_2$H$_6$, at a V/III ratio of about 330, and at a growth rate of 2 µm/hour.

A strained MQW active layer 5 is grown at a growth temperature of 710° C. by alternately exchanging source gases. The strained MQW active layer 5 is formed by alternately laminating a guide (barrier) layer of (Al$_{0.4}$Ga$_{0.6}$)$_{0.5}$In$_{0.5}$P and a quantum well layer of Ga$_{0.44}$In$_{0.56}$As$_{0.08}$P$_{0.92}$. The quantum well layer 5b has a distortion of about 1%. The guide layer having a thickness of 5 nm is grown four times, and the quantum well layer having a thickness of 6 nm is grown three times. The guide layer is grown at a V/III ratio of 400 and a growth speed of 1 µm/hour, and the quantum well layer is grown at a V/III ratio of 500 and a growth speed of 1 µm/hour.

A first p-type cladding layer 6 having a p-type impurity concentration of about $6 \times 10^{17}$ cm$^{-3}$ at a slant portion is grown to a thickness of 0.25 µm and a impurity concentration of $1 \times 10^{17}$ cm$^{-3}$ at the flat plane at a temperature of 710° C., by using as source gases TMA, TEG, TMI, and PH$_3$ and as dopant dimethylzinc (DMZn), at a V/III ratio of 330, and at a growth rate of 2 µm/hour.

A cladding and blocking layer 7 of p-type (Al$_{0.7}$Ga$_{0.3}$)$_{0.5}$In$_{0.5}$P is formed at a growth temperature of 710° C. by alternately doping DMZn and H$_2$S dopants to grow a Zn doped layer having a thickness of 5 nm and an S doped layer having a thickness of 5 nm for 20 periods, in total to a thickness of about 0.20 µm, and by using as source gases TMA, TEG, TMI, and PH$_3$, at a V/III ratio of 330, and at a growth rate of 2 µm/hour.

The doping is controlled to set the p-type impurity concentration to about $6 \times 10^{17}$ cm$^{-3}$ and the n-type impurity concentration to about $1 \times 10^{17}$ cm$^{-3}$ at the slant portion. At the flat plane, the p-type impurity concentration is about $2 \times 10^{17}$ cm$^{-3}$ and the n-type impurity concentration is about $8 \times 10^{17}$ cm$^{-3}$.

It is supposed however that p-type impurities in the slant portion diffuse and form a uniform impurity concentration. Therefore, the p-type impurity concentration in the slant portion is a half of the actual doping of about $1.2 \times 10^{18}$ cm$^{-3}$.

A third p-type cladding layer 8 of p-type (Al$_{0.7}$Ga$_{0.3}$)$_{0.5}$In$_{0.5}$P having a p-type impurity concentration of about $9 \times 10^{17}$ cm$^{-3}$ at a slant portion and a p-type impurity concentration of about $4 \times 10^{17}$ cm$^{-3}$ at a flat portion is grown to a thickness of 2.20 µm, by using as source gases TMA, TEG, TMI, and PH$_3$ and as p-type dopant Cp$_2$Mg, at a V/III ratio of 330 and at a growth rate of 2 µm/hour.

As the slant portion is doped at the same concentration by using p-type dopant Zn, the p-type impurity concentration at the main plane becomes about $1.5 \times 10^{17}$ cm$^{-3}$.

A p-type $Ga_{0.5}In_{0.5}P$ intermediate layer 9 having a p-type impurity concentration of about $1\times10^{18}$ cm$^{-3}$ at a slant portion is grown to a thickness of about 0.1 µm, by gently lowering the growth temperature from 710° to 670° C., by using as source gases TEG, TMI, and $PH_3$ and as dopant dimethylzinc (DMZn), at a V/III ratio of 500, and at a growth rate of 1 µm/hour.

A p-type GaAs contact layer 10 having a p-type impurity concentration of about $2\times10^{18}$ cm$^{-3}$ at a slant portion is grown to a thickness of about 1 µm, by using as source gases TMG and $AsH_3$ and as dopant dimethylzinc (DMZn), at a V/III ratio of 100, at a growth rate of 1 µm/hour, and at a growth temperature of 670° C.

With a series of epitaxial growth processes described above, an epitaxial lamination constituting the laser structure on the GaAs substrate 1 can be grown continuously.

Thereafter, grooves of 100 µm width are formed in the wafer, leaving the laser structure, and elements are separated. Next, a laminated layer of Au, Ge, and Au is vapor-deposited as an n-side electrode 21 on the bottom of the GaAs substrate 1, and a laminated layer of AuZn and Au is vapor-deposited as a p-side electrode 22 on the top of the p-type contact layer 10.

Thereafter, the wafer is cleaved into chips having a width of 300 µm and a length of 700 µm, and each chip is bonded to a heat sink disposing the p-type region downward.

Si is doped in the n-type cladding layer because the n-type impurity concentration at the slant portion is desired not to be lower than that at the main plane.

In the case of the semiconductor laser shown in FIG. 13, the cladding and blocking layer 7 of $(Al_{0.7}Ga_{0.3})_{0.5}In_{0.5}$ having a p-type impurity concentration of about $6\times10^{17}$ cm$^{-3}$ and an n-type impurity concentration of about $5\times10^{16}$ cm$^{-3}$ at the slant portion is grown to a thickness of 0.2 µm at a growth temperature of 710° C. by doping DMZn and $H_2S$ dopants at the same time, by using as source gases TMA, TEG, TMI, and $PH_3$, at a V/III ratio of 330 and at a growth rate of 2 µm/hour. At the flat portion, the p-type impurity concentration is about $1\times10^{17}$ cm$^{-3}$ and the n-type impurity concentration is about $4\times10^{17}$ cm$^{-3}$ at the flat portion.

The semiconductor layer manufactured as above has no bending portion in the light emitting effective active layer, and the cladding and blocking layer has also no bending portion and has a similar shape to that of the active layer. Furthermore, as described before, an improved property can be obtained by selecting the thicknesses of the first p-type cladding layer and the second p-type cladding layer (current blocking region), the impurities in the third p-type cladding layer, and the thickness of upper and lower cladding layers.

This embodiment structure further provides the following advantages. By doping the cladding and blocking layer with impurities having an incorporation factor depending on the crystal plane, it is possible to uniformly dope the cladding layer region and the blocking layer region. A uniform doping suppresses a need of increasing impurity concentrations.

If p-type and n-type impurities are alternately doped in the cladding and blocking layer, coupling between p- and n-type impurities reduces so that a probability of pairing can be efficiently lowered.

If p- and n-type impurities whose incorporation factors change greatly with a crystal plane are used, even if p- and n-type impurities are doped at the same time, coupling between p- and n-type impurities reduces so that a probability of pairing can be efficiently lowered.

If S having a very high crystal plane dependency is used, pairing between impurities can be efficiently lowered. Although Zn and Cd can be used as p-type impurities, if Cd having a higher crystal plane dependency is used, pairing between impurities can be efficiently lowered.

Also in the case of alternate doping, if doping sources such as S and Cd having a high crystal plane dependency are used, a compensation ratio after the diffusion of carriers or impurities can be lowered, and a small resistivity lateral pn junction can be formed even at a relatively low concentration doping.

If a thickness of each layer doped alternately is set to about 10 nm or less, a uniform impurity concentration in the laminated layer can be realized because of spreading of a carrier wave function.

Namely, it is conceivable that carriers are diffused uniformly over the whole laminated layer. As compared to a thick layer, a small resistivity lateral pn junction can therefore be formed at a relatively low concentration doping.

In the above description, an AlGaInP based group III-V compound semiconductor epitaxial layer is formed on a GaAs substrate. A group III-V compound semiconductor usable is not limited thereto. For example, InP, and other compounds may be used for a substrate instead of GaAs. As materials of the cladding layer and other layers formed on a substrate, AlGaAs, GaInP, InP, and AlInAs may be used. A substrate of a mixed crystal composition or group III-V compound semiconductor having four elements or more may also be used.

The present invention has been described in connection with the preferred embodiments. The invention is not limited only to the above embodiments. It will be apparent to those skilled in the art that various changes, modifications, combinations and the like can be made without departing from the scope of the appended claims.

We claim:

1. A method of manufacturing a semiconductor laser comprising the steps of:

preparing a stepped substrate of group III-V compound semiconductor having two flat surfaces exposing a plane (100) or a plane (n11)A (n being a real number, 7<n) and a slant surface exposing a plane (m11)A (m being a real number, $2 \leq m < 4$) and interconnecting the two flat surfaces; and forming a buffer layer to a thickness of 1 µm or more on said stepped substrate by metal organic vapor phase epitaxy (MOVPE), said buffer layer having two flat surfaces exposing a plane (100) or a plane (n11)A and a slant surface exposing a plane near a plane (411)A.

2. A method according to claim 1, further comprising the step of forming a lower cladding layer, an active layer, and an upper cladding layer by MOVPE on said buffer layer, following the formation of said buffer layer.

3. A method according to claim 2, wherein a crystal plane at the flat surfaces of said stepped substrate is selected so as to set an angle between the flat surfaces and the slant surface of said active layer in the range from 3 to 12 degrees.

4. A method of manufacturing a semiconductor laser comprising the steps of:

preparing a stepped substrate of group III-V compound semiconductor having two flat surfaces exposing a plane (100) or a plane (n11)A (n being a real number, 7<n) and a slant surface exposing a plane (m11)A (m being a real number, $2 \leq m \leq 7$) and interconnecting the two flat surfaces;

epitaxially growing on said stepped substrate an active layer having two flat surfaces exposing a plane (100) or a plane (n11)A and a slant surface exposing a plane (k11)A (k being a real number, 3≦k≦7), the slant surface of the active layer interconnecting the two flat surfaces of the active layer;

epitaxially growing on said active layer a first p-type cladding layer having a high p-type impurity concentration at a region along the slant surface and a low p-type impurity concentration at a region along the flat surfaces; and epitaxially growing, on said first p-type cladding layer, p-type thin layer and n-type thin layer alternately two periods or more, said p-type thin layer having a high p-type impurity concentration at a region along the slant surface and a low p-type impurity concentration at a region along the flat surfaces, and said n-type thin layer having a low n-type impurity concentration at a region along the slant surface and a high n-type impurity concentration at a region along the flat surfaces.

5. A method according to claim 4, wherein said n-type impurity is S.

6. A method according to claim 4, wherein the thicknesses of said p-type thin layer and said n-type thin layer are 10 nm or less.

7. A method according to claim 4, further comprising the step of growing a buffer layer having the same composition as said stepped substrate on said substrate to a thickness of about 1 μm or more, before said step of epitaxially growing said active layer.

8. A semiconductor laser comprising:

a stepped substrate of group III-V compound semiconductor having two flat surfaces exposing a plane (100) or a plane (n11)A (n being a real number, 7<n) and a slant surface exposing a plane (m11)A (m being a real number, 2≦m≦7) and interconnecting the two flat surfaces;

an active layer formed on said stepped substrate and having two flat surfaces exposing a plane (100) or a plane (n11)A and a slant surface exposing the plane (k11)A (k being a real number, 3≦k≦7), the slant surface interconnecting the two flat surfaces;

a first p-type cladding layer laminated on said active layer and having a high p-type impurity concentration at a region along the slant surface and a low p-type impurity concentration at a region along the flat surfaces; and a single cladding and blocking layer laminated on said first p-type cladding layer, said cladding and blocking layer includes a p-type thin layer and an n-type thin layer alternately laminated two periods or more, said p-type thin layer having a first p-type impurity concentration at a region along the slant surface and a second p-type impurity concentration, which is lower than said first p-type impurity concentration, at a region along the flat surfaces, and said n-type thin layer having a low n-type impurity concentration at a region along the slant surface and a high n-type impurity concentration at a region along the flat surfaces.

9. A semiconductor laser according to claim 8, further comprising a buffer layer formed to a thickness of about 1 μm or more on said stepped substrate under the active layer, said buffer layer containing the same composition as said stepped substrate.

10. A semiconductor laser according to claim 8, wherein said n-type impurity is S.

11. A semiconductor laser according to claim 10, wherein said p-type thin film and said n-type thin film form a single p-type region at a region along the slant surface.

12. A semiconductor laser according to claim 10, wherein the thicknesses of said p-type thin film and said n-type thin film are 10 nm or less.

13. A method according to claim 2, further comprising the step of forming a single cladding and blocking layer on said upper cladding layer, said single cladding and blocking layer being formed by growing p-type and n-type thin layers alternately two periods or more, said p-type thin layer having a high p-type impurity concentration at a region along the slant surface and a low p-type impurity concentration at a region along the flat surface, and said n-type thin layer having a low n-type impurity concentration at a region along the slant surface and a high n-type impurity concentration at a region along the flat surface.

* * * * *